US012642042B2

(12) United States Patent
Lin et al.

(10) Patent No.: US 12,642,042 B2
(45) Date of Patent: May 26, 2026

(54) METHOD AND APPARATUS FOR BONDING SEMICONDUCTOR SUBSTRATE

(71) Applicant: Taiwan Semiconductor Manufacturing Company, Ltd., Hsinchu (TW)

(72) Inventors: Yu-Sheng Lin, Taichung City (TW); Yang-Chih Hsueh, Hsinchu City (TW); Yan-Zuo Tsai, Hsinchu City (TW); Ming-Tsu Chung, Hsinchu (TW); Yung-Chi Lin, New Taipei City (TW); Yen-Ming Chen, Hsin-Chu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 124 days.

(21) Appl. No.: 18/531,647

(22) Filed: Dec. 6, 2023

(65) Prior Publication Data

US 2025/0191941 A1        Jun. 12, 2025

(51) Int. Cl.
H10P 72/00 (2026.01)
H10P 72/70 (2026.01)
H10P 72/76 (2026.01)

(52) U.S. Cl.
CPC .......... H10P 72/0438 (2026.01); H10P 72/74 (2026.01); H10P 72/7604 (2026.01); H10P 72/7436 (2026.01)

(58) Field of Classification Search
CPC .......... H01L 21/67121; H01L 21/6835; H01L 21/68714; H01L 21/6838; H01L 2221/68372
See application file for complete search history.

(56) References Cited

U.S. PATENT DOCUMENTS

| | | | |
|---|---|---|---|
| 2019/0096735 A1* | 3/2019 | Liao | H01L 21/6838 |
| 2021/0091022 A1* | 3/2021 | Chen | H01L 24/03 |
| 2022/0250168 A1* | 8/2022 | Nishri | H01L 21/67288 |
| 2023/0207514 A1* | 6/2023 | Gao | H01L 24/74 |
| | | | 438/107 |

FOREIGN PATENT DOCUMENTS

| | | |
|---|---|---|
| TW | 201541550 | 11/2015 |
| TW | 201621991 | 6/2016 |

* cited by examiner

*Primary Examiner* — Alex B Efta
*Assistant Examiner* — Alexander S Wright
(74) *Attorney, Agent, or Firm* — JCIPRNET

(57) ABSTRACT

A method of bonding semiconductor chips is described. The method includes the following steps. A semiconductor wafer is provided on a chuck table of a bonding apparatus. A bond head of the bonding apparatus is driven for picking up a first semiconductor chip from a support, wherein the first semi-conductor chip has a first warpage amount. The bond head is driven for moving the first semiconductor chip to a position located over a first bonding region of the semiconductor wafer. A deforming process is performed using a deforming mechanism to deform the chuck table and the first bonding region of the semiconductor wafer by a first deform amount, wherein the first deform amount corresponds to the first warpage amount. The first semiconductor chip is bonded to the first bonding region of the semiconductor wafer while maintaining the first deform amount. The deforming mechanism is released from deforming the chuck table.

20 Claims, 25 Drawing Sheets

METHOD AND APPARATUS FOR BONDING SEMICONDUCTOR SUBSTRATE

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. In the course of advancement and innovation, the formation of semiconductor devices usually involves bonding of two or more semiconductor wafers together, or bonding two or more semiconductor chips on a semiconductor wafer.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
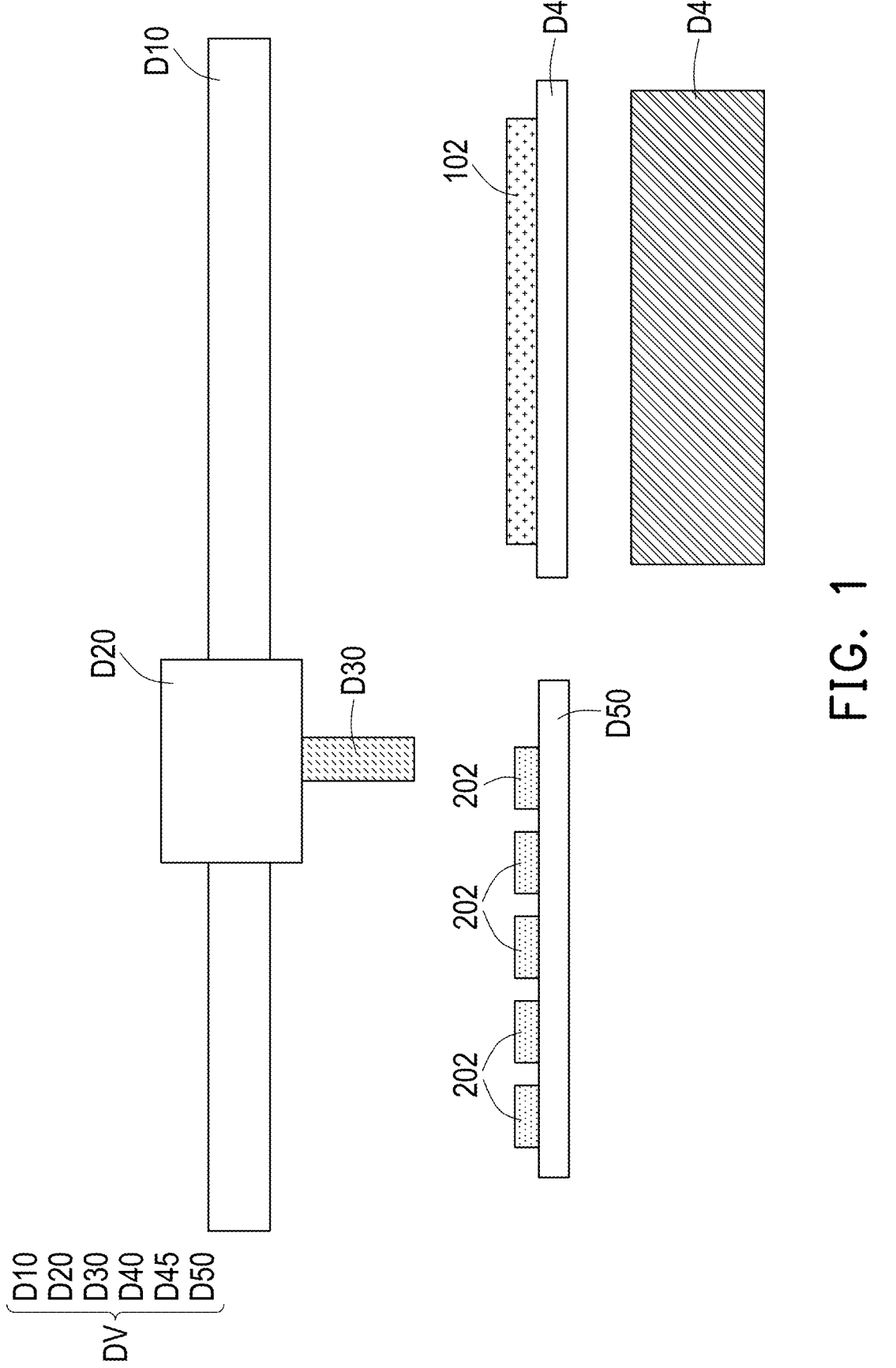
FIG. 1 to FIG. 17B are schematic sectional and top views of various stages in a method of bonding semiconductor chips according to some exemplary embodiments of the disclosure.
Figure 2:
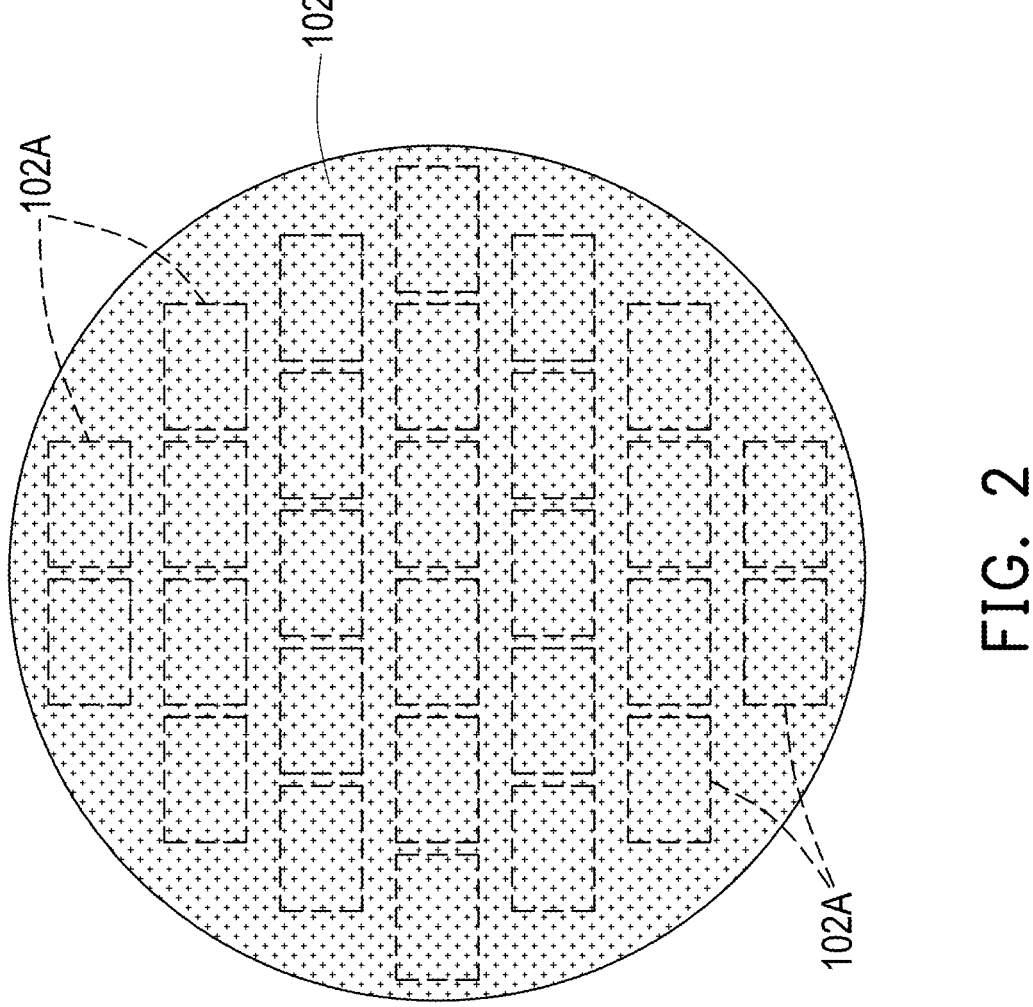

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the bonding of semiconductor chips onto a semiconductor wafer, interface bulge defect may occur due to local warpage of the top die (chip). As the chip-on-wafer (CoW) pad size/pitch is reduced, the local warpage of the top die will cause a larger expansion-induced overlay shift, which will result in a die bonding mismatch, thus causing a concern in the wafer acceptance testing (WAT). In some embodiments of the present disclosure, in order to prevent the top die warpage induced interface bulge defect, the bottom wafer is deformed to compensate for the top die warpage.

FIG. 1 to FIG. 17B are schematic sectional and top views of various stages in a method of bonding semiconductor chips according to some exemplary embodiments of the disclosure. The method of bonding semiconductor chips of the present disclosure is, for example, a method of bonding semiconductor chips onto a semiconductor wafer, or a chip-on-wafer (CoW) bonding method. Referring to FIG. 1, in some embodiments, a bonding apparatus DV is used for bonding semiconductor chips 202 (or semiconductor dies) onto a semiconductor wafer 102.

As illustrated in FIG. 1, the bonding apparatus DV includes a gantry frame D10, a guide piece D20, a bond head D30, a chuck table D40, a deforming mechanism D45, and a support D50. The guide piece D20 and the bond head D30 are movably installed on the gantry frame D10. The actions of the bond head D30 may be controlled by a driving unit (e.g., motor, controller, and processor, etc.; not shown). For example, the driving unit of the gantry frame D10 is configured to drive the bond head D30 to the locations between the chuck table D40 and the support D50. In some embodiments, the bond head D30 is controlled to move downwardly and pick up the semiconductor chips 202 from the support D50, and move the semiconductor chips 202 towards the chuck table D40.

The chuck table D40 is used for supporting a semiconductor wafer 102. For example, the chuck table D40 may include a clamping fixture (not shown) or other fixing mechanisms for securing the semiconductor wafer 102 located thereon. In some embodiments, the chuck table D40 includes a driving unit (e.g., motor, controller, and processor, etc.; not shown) for adjusting an x position, a y position, a z position, and/or an angular position of the chuck table D40. In certain embodiments, the chuck table D40 is a deformable chuck table, and can be made of any deformable material or flexible material. For example, the chuck table D40 may include a flexible organic material, a polymer material, or the like. In some embodiments, the chuck table D40 is deformed by a deforming mechanism D45 in the bonding apparatus DV. In certain embodiments, the deforming mechanism D45 is configured to deform the chuck table D40 along with the semiconductor wafer 102 located thereon.

Referring to FIG. 1, in the method of bonding semiconductor chips of the present disclosure, a semiconductor wafer 102 is first provided on the chuck table D40 of the bonding apparatus DV, while semiconductor chips 202 are provided on the support D50. In some embodiments, the semiconductor wafer 102 includes active devices, passive devices, redistribution layers, one or more conductive elements and dielectric layers formed therein. As further illustrated in FIG. 2, from a top view of the semiconductor wafer 102, the semiconductor wafer 102 includes a plurality of bonding regions 102A, whereby the bonding regions 102A are regions on the semiconductor wafer 102 intended for bonding to the semiconductor chips 202.

Prior to bonding the semiconductor chips 202 to the semiconductor wafer 102, a warpage amount of each of the semiconductor chips 202 are measured to determine a main bonding position of the semiconductor chips 202. For example, FIG. 3A to FIG. 3F illustrates the different types of warpage of the semiconductor chips 202, and the way to determine the main bonding position MB1 in the semiconductor chips 202. As illustrated in FIG. 3A to FIG. 3F, the semiconductor chip 202 has a bonding surface 202A, a rear surface 202B opposite to the bonding surface 202A, and a boundary 202C joining the bonding surface 202A to the rear surface 202B.

Figure 3A:
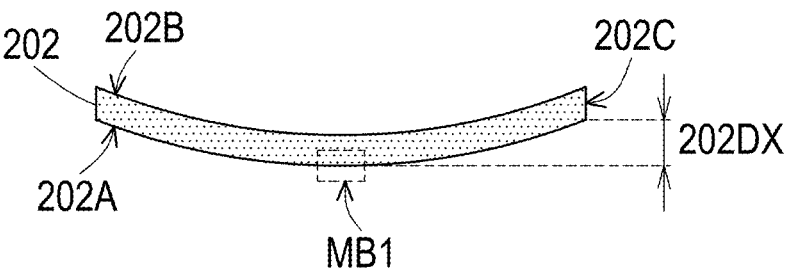
Figure 3B:
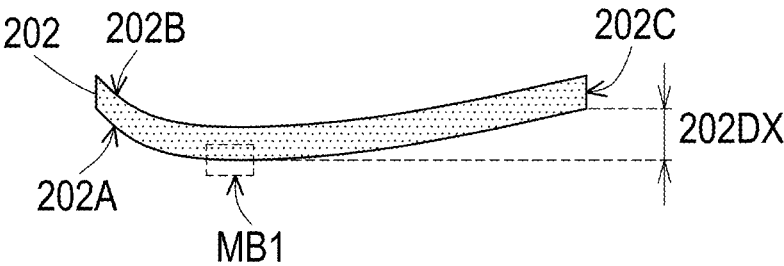
Figure 3C:
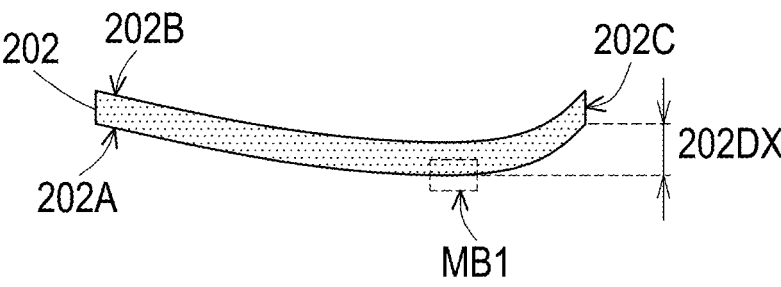

In the embodiment shown in FIG. 3A to FIG. 3C, the semiconductor chips 202 has a smile warpage, whereby the bonding surface 202A is bent outwards in a direction away from the semiconductor wafer 102 during bonding. In some embodiments, a position on the bonding surface 202A of the semiconductor chip 202 having a maximum height difference 202DX relative to the boundary 202C of the semiconductor chip 202 is determined as a main bonding position MB1 of the semiconductor chip 202. For example, the maximum height difference 202DX at the bonding surface 202A of the semiconductor chip 202 is a difference that is measured from a center area of the semiconductor chip 202 towards the boundary 202C. In some embodiments, the maximum height difference 202DX at the bonding surface 202A of the semiconductor chip 202 is also a warpage amount of the semiconductor chip 202. As further illustrated in FIG. 3A to FIG. 3C, the main bonding position MB1 of the semiconductor chip 202 is not particularly limited, but may be located at a center area of the semiconductor chip 202 (FIG. 3A), or may be skewed towards a left side (see FIG. 3B) or a right side (see FIG. 3C) position of the semiconductor chip 202.

Figure 3D:
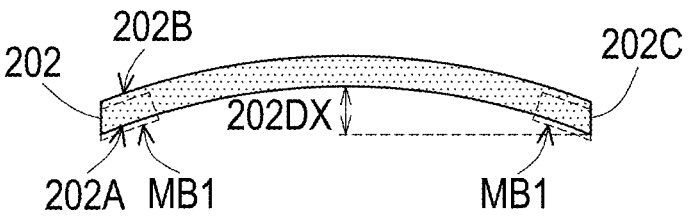
Figure 3E:
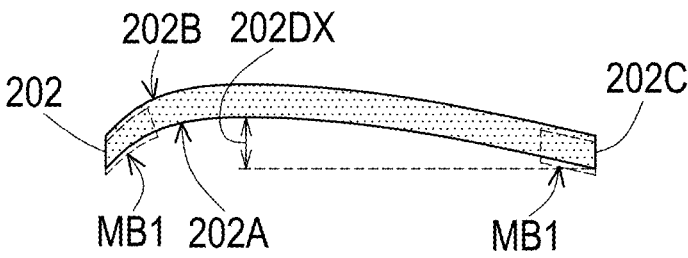
Figure 3F:
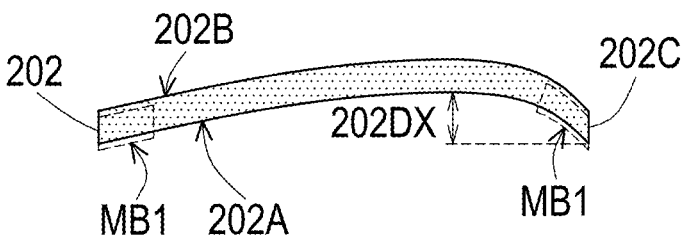

In the embodiment shown in FIG. 3D to FIG. 3F, the semiconductor chips 202 has a cry warpage, whereby the bonding surface 202A is bent inwards in a direction facing the semiconductor wafer 102 during bonding. In some embodiments, a position on the bonding surface 202A of the semiconductor chip 202 having a maximum height difference 202DX relative to the boundary 202C of the semiconductor chip 202 is determined as a warpage amount of the semiconductor chip 202. As illustrated in FIG. 3D to FIG. 3F, the position having the maximum height difference 202DX is not particularly limited, but may be located at a center area of the semiconductor chip 202 (FIG. 3D), or may be skewed towards a left side (see FIG. 3E) or right side (see FIG. 3F) position of the semiconductor chip 202. Furthermore, in the exemplary embodiment, since the semiconductor chop 202 has a cry warpage, edge portions at the bonding surface 202A of the semiconductor chip 202 is determined as a main bonding position MB1 of the semiconductor chip 202.

Figure 4:
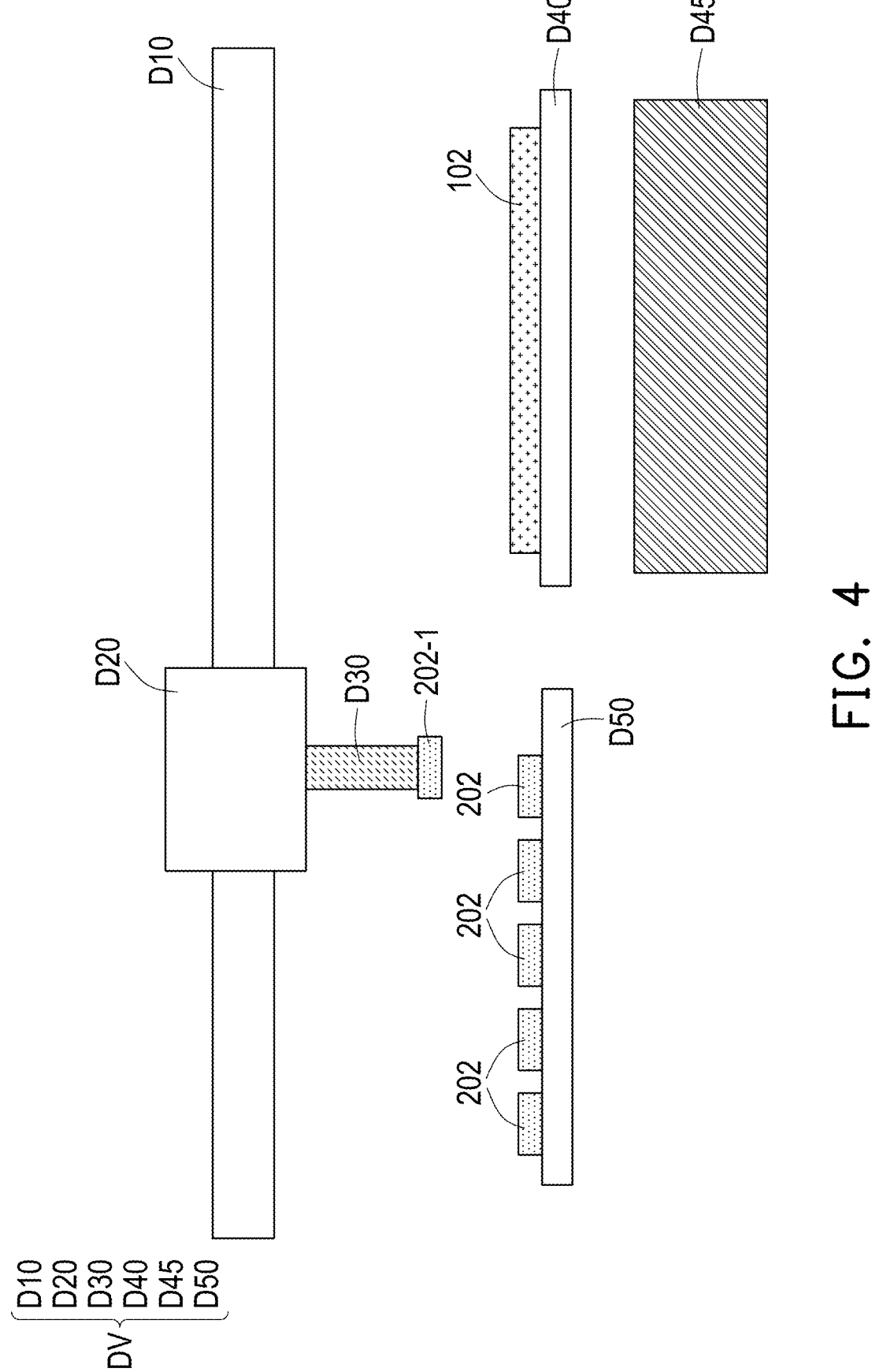

Referring to FIG. 4, after measuring a first warpage amount of a first semiconductor chip 202-1 (from semiconductor chips 202) to determine the main bonding position MB1 of the first semiconductor chip 202-1, a picking process and a placing/bonding process of the first semiconductor chip 202-1 using the bonding apparatus DV is performed. For example, in some embodiments, a bond head D30 of the bonding apparatus DV is driven to a position located over the support D50 to pick up the first semiconductor chip 202-1 from the support D50. The first semiconductor chip 202-1 may have the first warpage amount that corresponds to the maximum height difference 202DX shown in any one of the embodiments of FIG. 3A to FIG. 3F.

Figure 5A:
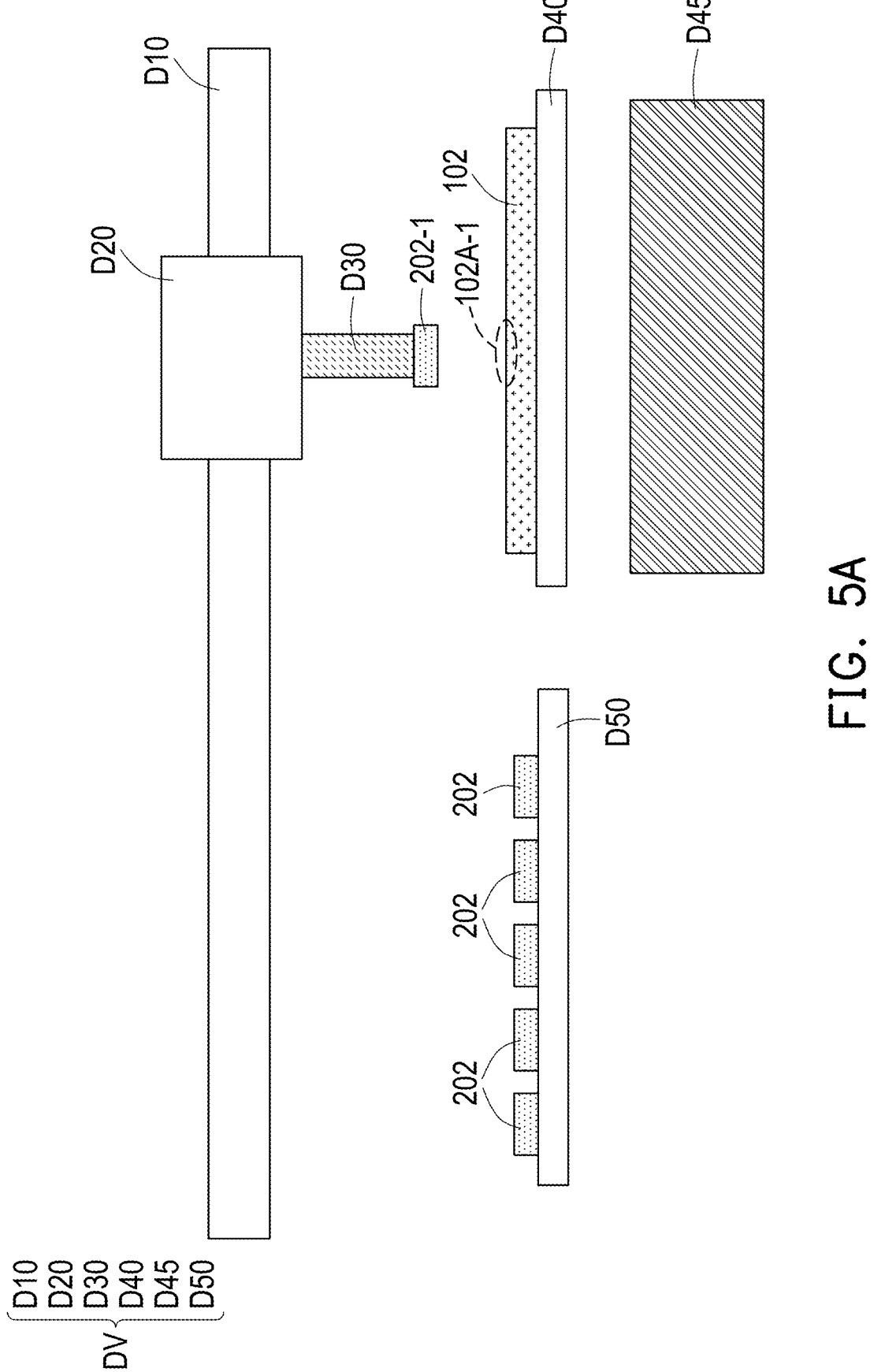
Figure 5B:
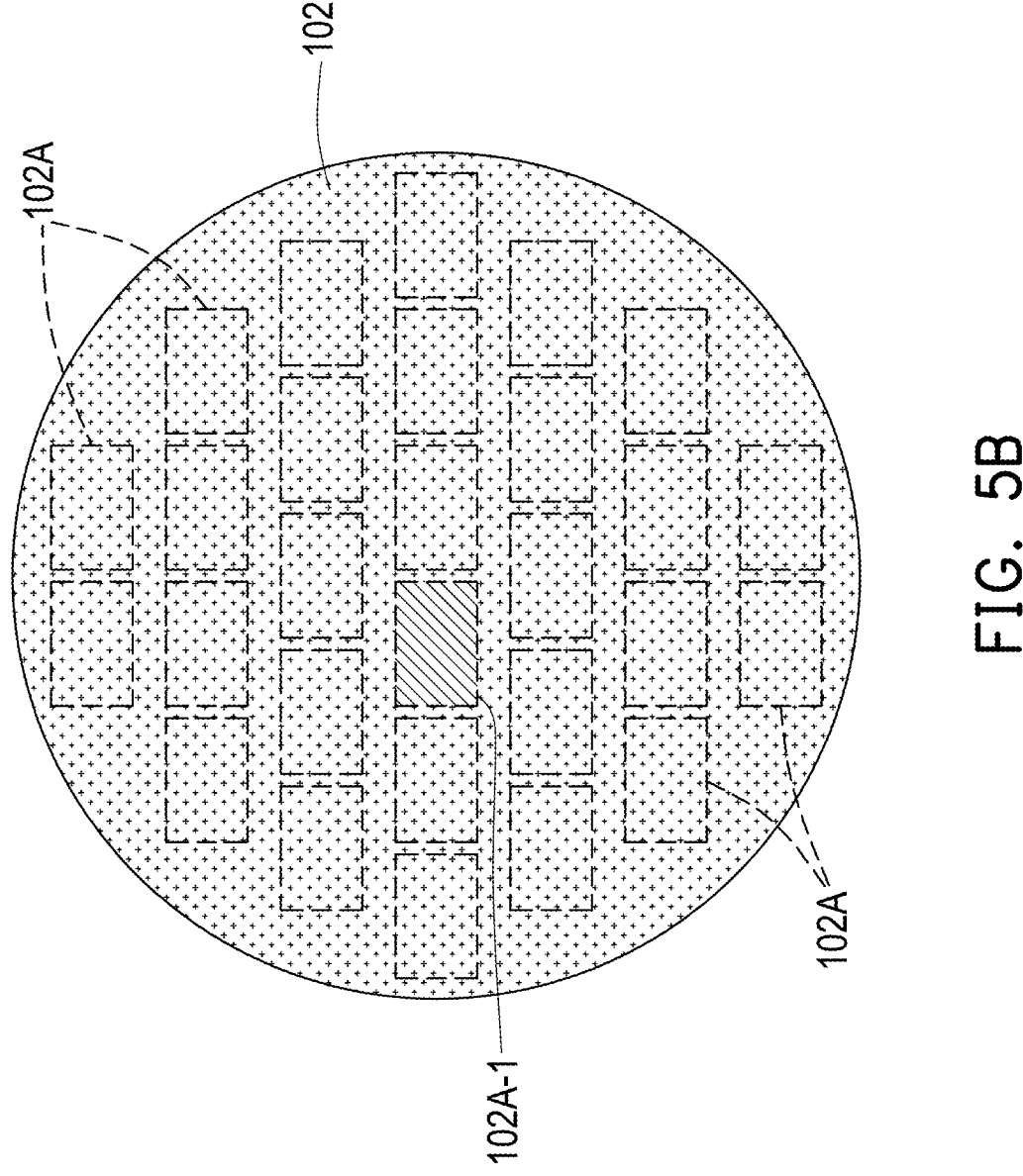

Subsequently, referring to FIG. 5A and FIG. 5B, the bond head D30 is driven for moving the first semiconductor chip 202-1 to a position located over a first bonding region 102A-1 of the semiconductor wafer 102. The position of the first bonding region 102A-1 on the semiconductor wafer 102 is not particularly limited, and may be adjusted based on bonding requirements. Thereafter, as illustrated in FIG. 5A, and from a top view of the semiconductor wafer 102 as shown in FIG. 5B, a bonding process may be performed for bonding the first semiconductor chip 202-1 to the first bonding region 102A-1 of the semiconductor wafer 102. It should be appreciated that although only one bond head D30 is illustrated as an example, more than one bond heads D30 may be installed on the guide piece D20. For example, multiple bond heads D30 may perform a pick-and-place process in turns, and each bond head D30 may be controlled independently from the actions of other bond heads D30.

During the bonding process of bonding the first semiconductor chip 202-1 to the first bonding region 102A-1 of the semiconductor wafer 102, a deforming process is performed using the deforming mechanism D45 of the bonding apparatus DV to deform the chuck table D40 along with the first bonding region 102A-1 of the semiconductor wafer 102. Depending on whether the first semiconductor chip 202-1 has a smile warpage or a cry warpage, different deforming processes using the deforming mechanism D45 may be performed. The different deforming processes and bonding processes will be described with reference to FIG. 6A to FIG. 15.

Figures 6A, 6B:
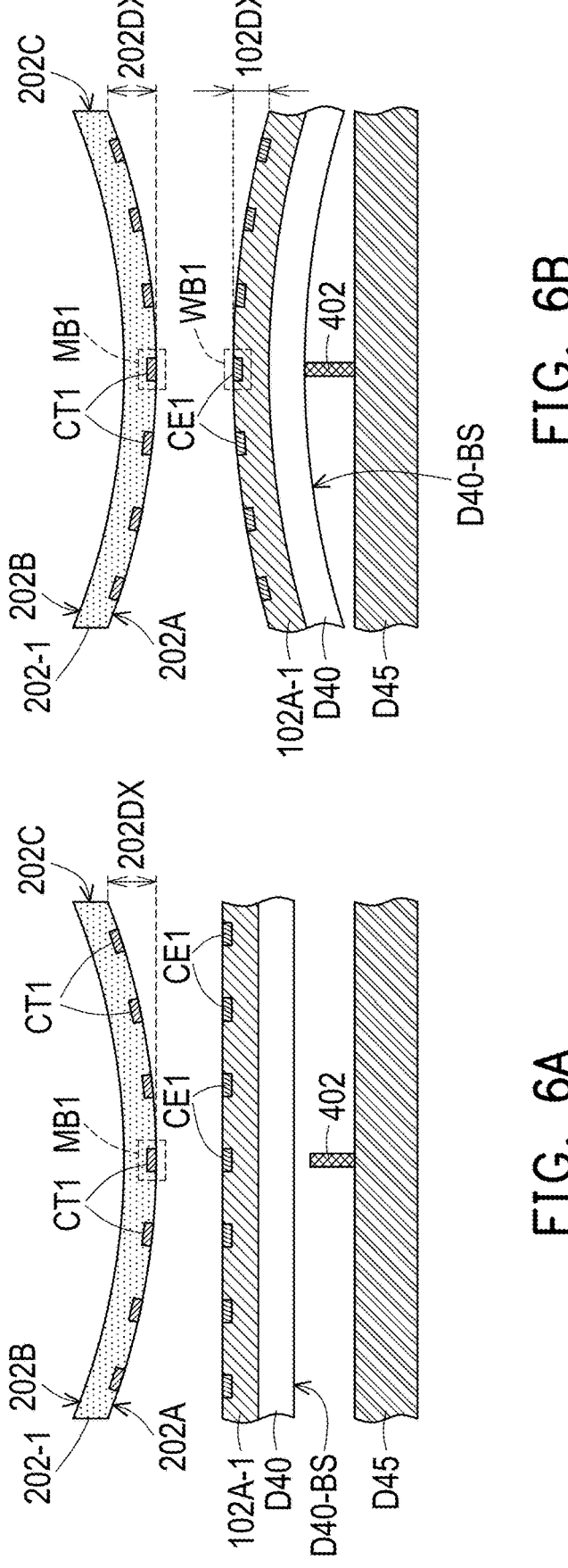
Figure 6C:
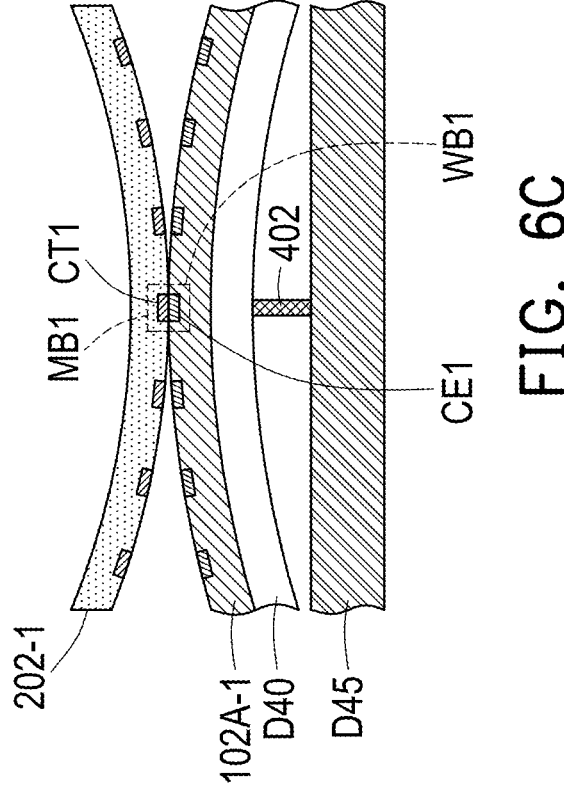

FIG. 6A to FIG. 6C are schematic sectional views of various stages in a method of bonding a semiconductor chip to the semiconductor wafer in accordance with some embodiments of the present disclosure. Referring to FIG. 6A, in some embodiments, the first semiconductor chip 202-1 has a smile warpage with a first warpage amount (maximum height difference 202DX) corresponding to that described in FIG. 3A. Furthermore, the first semiconductor chip 202-1 includes a plurality of conductive terminals CT1 located on a bonding surface 202A of the first semiconductor chip 202-1 for bonding to conductive elements CE1 located on the surface of the first bonding region 102A-1 of the semiconductor wafer 102. In some embodiments, the bonding includes a metal-to-metal bonding technology, dielectric-to-dielectric bonding technology, or a combination thereof. In some embodiments, prior to bonding the first semiconductor chip 202-1 to the semiconductor wafer 102, the deforming process of the chuck table D40 and the first bonding region 102A-1 of the semiconductor wafer 102 is performed using the deforming mechanism D45. In the exemplary embodiment, the deforming mechanism D45 includes a pin structure 402 that has a strength to deform the chuck table D40 along with the semiconductor wafer 102 when pushed onto a backside surface D40-BS of the chuck table D40.

For example, referring to FIG. 6B, the pin structure 402 is pushed onto the backside surface D40-BS of the chuck table D40 so that a wafer bonding position WB1 of the semiconductor wafer 102 is protruding out towards the main bonding position MB1 of the first semiconductor chip 202-1. In other words, the protruding of the wafer bonding position WB1 in the first bonding region 102A-1 of the semiconductor wafer 102 is generated by a pressing force of pressing the pin structure 402. In the exemplary embodiments, since the first semiconductor chip 202-1 has a smile warpage, the first bonding region 102A-1 of the semiconductor wafer 102 is deformed to have a cry warpage.

In some embodiments, the deforming process is performed using the pin structure 402 so that the first bonding region 102A-1 of the semiconductor wafer 102 is deformed by a first deform amount 102DX. In the exemplary embodiment, the first deform amount 102DX of the semiconductor wafer 102 corresponds to the first warpage amount (maximum height difference 202DX) of the first semiconductor chip 202-1. For example, in one embodiment, if the first warpage amount (maximum height difference 202DX) of the first semiconductor chip 202-1 is 50 μm, then the first deform amount 102DX is set to be approximately 50 μm to compensate for the warpage of the first semiconductor chip 202-1. In some embodiments, the first deform amount 102DX is controlled by adjusting a pressing force, or adjusting a height of the pin structure 402.

Furthermore, in the illustrated embodiment, although the pin structure 402 is shown to be pressed onto a center area in the first bonding region 102A-1 of the semiconductor wafer 102 to generate the protruding wafer bonding position WB1, it should be noted that the pressing of the pin structure 402 may be altered depending on the main bonding position MB1 of the first semiconductor chip 202-1. For example, if the main bonding position MB1 is skewed towards a left-side or a right-side position as shown in FIG. 3B or FIG. 3C, then the pin structure 402 is pressed in a way so that the wafer bonding position WB1 is also skewed in the corresponding manner.

Referring to FIG. 6C, in some embodiments, the bonding of the first semiconductor chip 202-1 to the first bonding region 102A-1 of the semiconductor wafer 102 is achieved by matching and joining the main bonding position MB1 of the first semiconductor chip 202-1 to the wafer bonding position WB1 in the first bonding region 102A-1 of the semiconductor wafer 102. In some embodiments, bonding the first semiconductor chip 202-1 to the semiconductor wafer 102 further includes matching and joining the conductive terminals CT1 in the main bonding position MB1 of the first semiconductor chip 202-1 to the conductive elements CE1 in the wafer bonding position WB1 in the first bonding region 102A-1 of the semiconductor wafer 102. In some embodiments, the bonding of the first semiconductor chip 202-1 to the semiconductor wafer 102 is performed while maintaining the first deform amount 102DX of the first bonding region 102A-1 of the semiconductor wafer 102. In certain embodiments, after the deforming mechanism D45 is released (pin structure 402 retracted), the bonding of the first semiconductor chip 202-1 to the semiconductor wafer 102 is achieved through bonding. In the exemplary embodiment, since the first bonding region 102A-1 of the semiconductor wafer 102 is deformed during the bonding of the first semiconductor chip 202-1 thereto, the die warpage is compensated, and a die bonding mismatch issue is resolved.

Figures 7A, 7B:
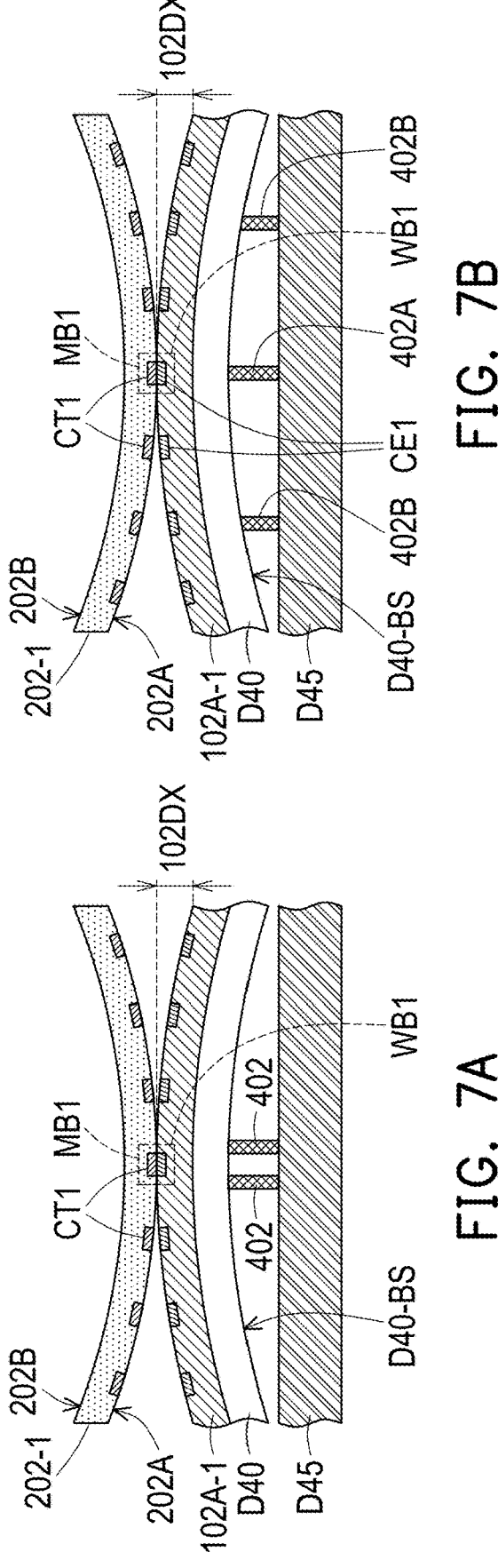

FIG. 7A and FIG. 7B are schematic sectional views of one stage in a method of bonding the first semiconductor chip to the semiconductor wafer according to some alternative embodiments of the present disclosure. The methods illustrated in FIG. 7A and FIG. 7B are similar to the method illustrated in FIG. 6A to FIG. 6C. Thus, the same reference numerals are used to refer to the same or liked parts, and its detailed description are not repeated herein. In the previous embodiment, although only one pin structure 402 is illustrated as the deforming mechanism D45, it should be noted that the number of pin structure 402 is not limited thereto. For example, referring to FIG. 7A, in one embodiment, the deforming mechanism D45 includes a plurality of pin structures 402 for pushing a center area of the backside surface D40-BS of the chuck table D40 to deform the first bonding region 102A-1 of the semiconductor wafer 102 by the first deform amount 102DX. Referring to FIG. 7B, in another embodiment, the deforming mechanism D45 includes a plurality of pin structures (402A, 402B) for pushing various regions of the backside surface D40-BS of the chuck table D40 to deform the first bonding region 102A-1 of the semiconductor wafer 102 by the first deform amount 102DX. For example, in FIG. 7B the pin structures include first pin structure 402A and second pin structures 402B, whereby the first pin structure 402A has a greater height than the second pin structures 402B. From the above embodiments, it is noted that the number and height of the pin structures 402 is not particularly limited as along as the first bonding region 102A-1 of the semiconductor wafer 102 is deformed by the first deform amount 102DX.

Figures 8A, 8B:
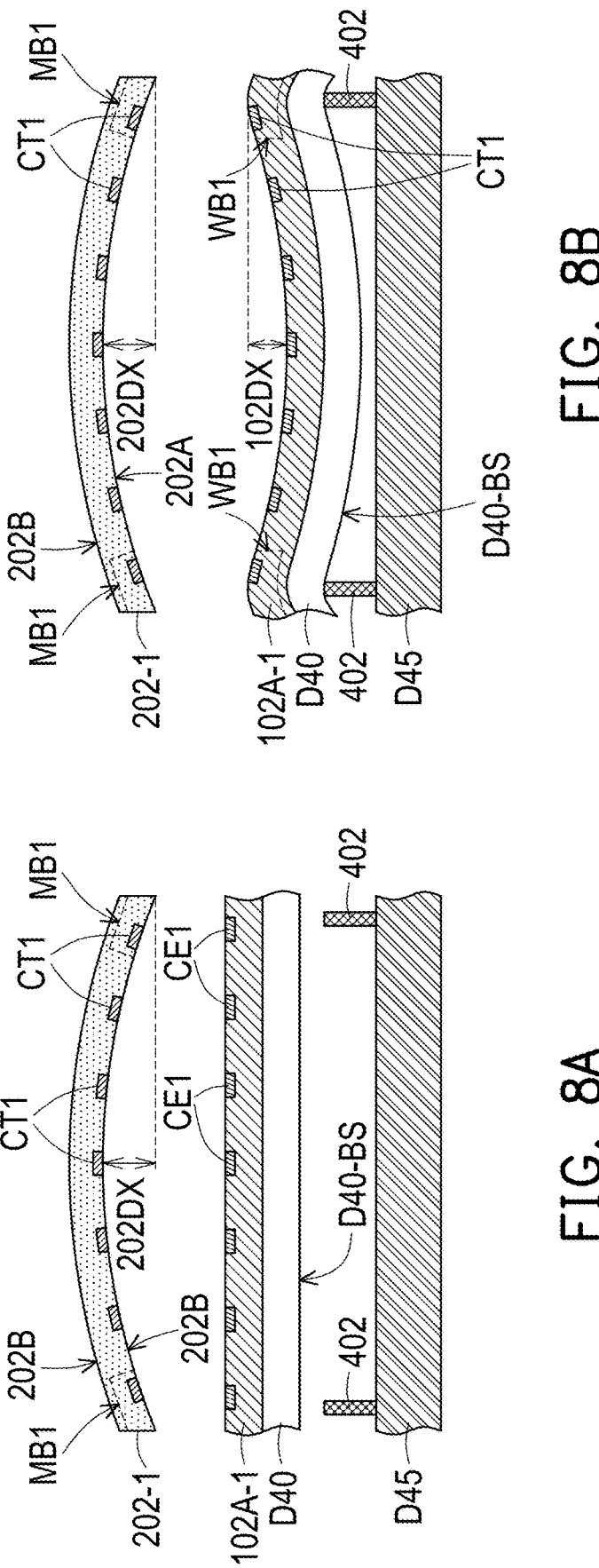
Figure 8C:
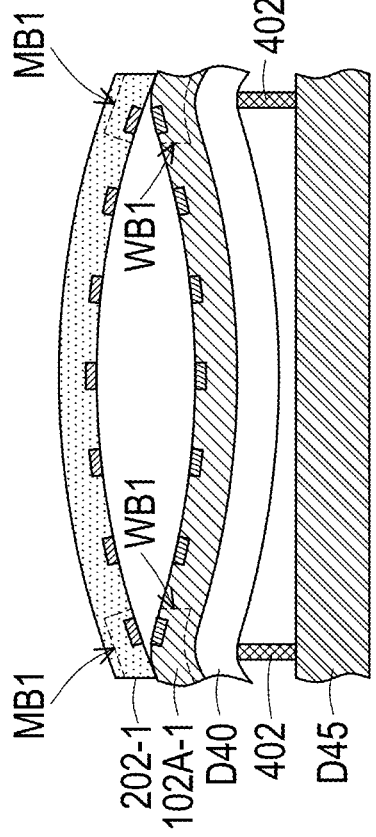

FIG. 8A to FIG. 8C are schematic sectional views of various stages in a method of bonding a semiconductor chip to the semiconductor wafer in accordance with some other embodiments of the present disclosure. The methods illustrated in FIG. 8A to FIG. 8C are similar to the method illustrated in FIG. 6A to FIG. 6C. Thus, the same reference numerals are used to refer to the same or liked parts, and its detailed description are not repeated herein. Referring to FIG. 8A, in some embodiments, the first semiconductor chip 202-1 has a cry warpage with a first warpage amount (maximum height difference 202DX) corresponding to that described in FIG. 3D. In some embodiments, prior to bonding the first semiconductor chip 202-1 to the semiconductor wafer 102, the deforming process of the chuck table D40 and the first bonding region 102A-1 of the semiconductor wafer 102 is performed using the deforming mechanism D45. In the exemplary embodiment, the deforming mechanism D45 includes a plurality of pin structures 402 that has a strength to deform the chuck table D40 along with the semiconductor wafer 102 when pushed onto a backside surface D40-BS of the chuck table D40.

For example, referring to FIG. 8B, the pin structures 402 are pushed onto the backside surface D40-BS of the chuck table D40 so that a wafer bonding position WB1 located at edge portions of the semiconductor wafer 102 is protruding out towards the main bonding position MB1 of the first semiconductor chip 202-1. In other words, the protruding of the wafer bonding position WB1 in the first bonding region 102A-1 of the semiconductor wafer 102 is generated by a pressing force of pressing the pin structure 402. In the exemplary embodiments, since the first semiconductor chip 202-1 has a cry warpage, the first bonding region 102A-1 of the semiconductor wafer 102 is deformed to have a smile warpage. In some embodiments, the deforming process is performed using the pin structures 402 so that edge portions of the first bonding region 102A-1 of the semiconductor wafer 102 is deformed by a first deform amount 102DX. In the exemplary embodiment, the first deform amount 102DX of the semiconductor wafer 102 corresponds to the first warpage amount (maximum height difference 202DX) of the first semiconductor chip 202-1.

Referring to FIG. 8C, in some embodiments, the bonding of the first semiconductor chip 202-1 to the first bonding region 102A-1 of the semiconductor wafer 102 is achieved by matching and joining the main bonding position MB1 at edge portions of the first semiconductor chip 202-1 to the wafer bonding position WB1 in the first bonding region 102A-1 of the semiconductor wafer 102. In some embodiments, bonding the first semiconductor chip 202-1 to the semiconductor wafer 102 further includes matching and joining the conductive terminals CT1 in the main bonding position MB1 of the first semiconductor chip 202-1 to the conductive elements CE1 in the wafer bonding position WB1 in the first bonding region 102A-1 of the semiconductor wafer 102. In the exemplary embodiment, since the first bonding region 102A-1 of the semiconductor wafer 102 is deformed during the bonding of the first semiconductor chip 202-1 thereto, the die warpage is compensated, and a die bonding mismatch issue is resolved.

Figures 9A, 9B:
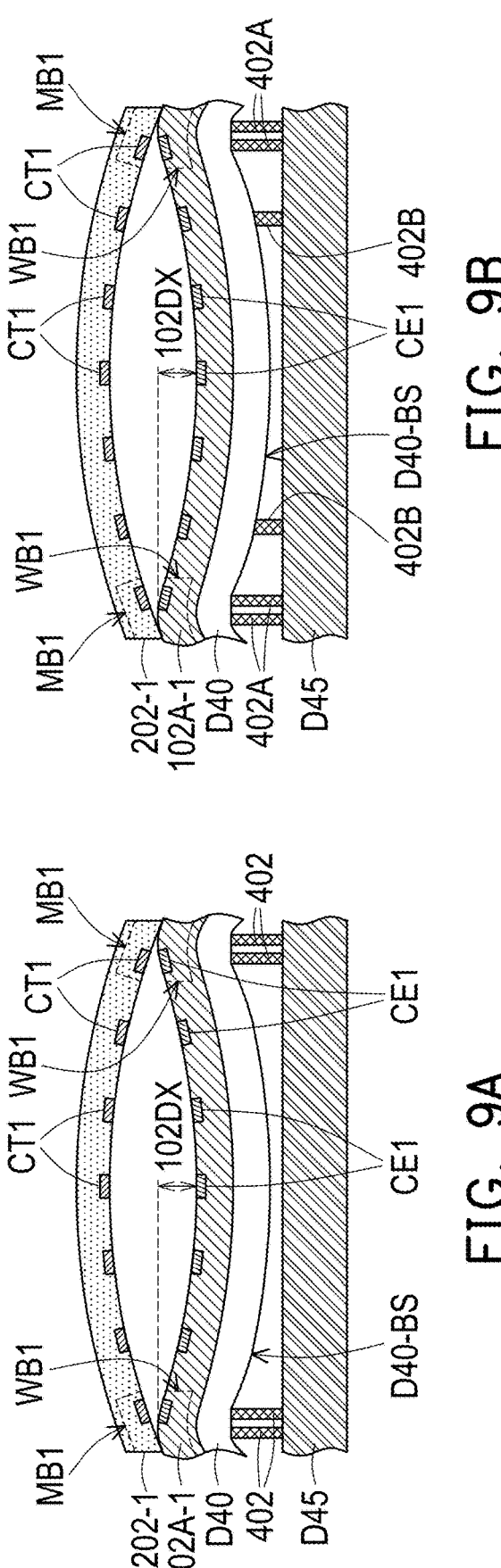

FIG. 9A and FIG. 9B are schematic sectional views of one stage in a method of bonding the first semiconductor chip to the semiconductor wafer according to some alternative embodiments of the present disclosure. The methods illustrated in FIG. 9A and FIG. 9B are similar to the method illustrated in FIG. 8A to FIG. 8C. Thus, the same reference numerals are used to refer to the same or liked parts, and its detailed description are not repeated herein. In the embodiment shown in FIG. 8A to FIG. 8C, the pin structures 402 may be arranged in a single loop encircling edge portions of the first bonding region 102A-1 of the semiconductor wafer 102. However, the disclosure is not limited thereto. For example, referring to FIG. 9A, the deforming mechanism D45 includes a plurality of pin structures 402 arranged in two loops encircling the edge portions of the first bonding region 102A-1. For example, the pin structures 402 arranged in a first loop and arranged in a second loop may have substantially the same height.

Furthermore, referring to FIG. 9B, in some alternative embodiment, the deforming mechanism D45 includes a plurality of pin structures (402A, 402B) for pushing various regions of the backside surface D40-BS of the chuck table D40 to deform the first bonding region 102A-1 of the semiconductor wafer 102 by the first deform amount 102DX. For example, the pin structures in FIG. 9B include first pin structure 402A and second pin structures 402B, whereby the first pin structure 402A has a greater height than the second pin structures 402B. Furthermore, the first pin structures 402A are arranged in two loops encircling the edge portions of the first bonding region 102A-1, while the second pin structures 402B are arranged in a loop located in between a center portion and the edge portions of the first bonding region 102A-1.

Figures 10A, 10B:
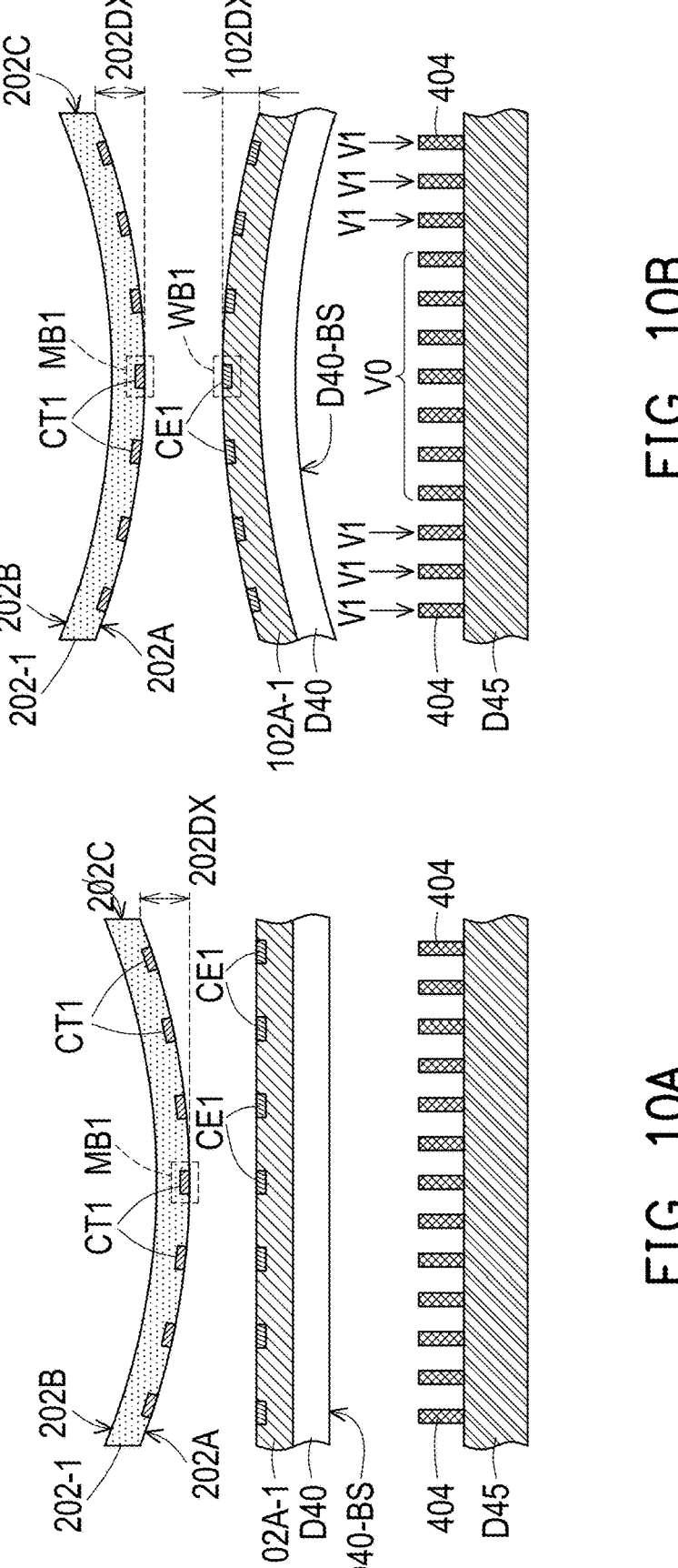
Figure 10C:
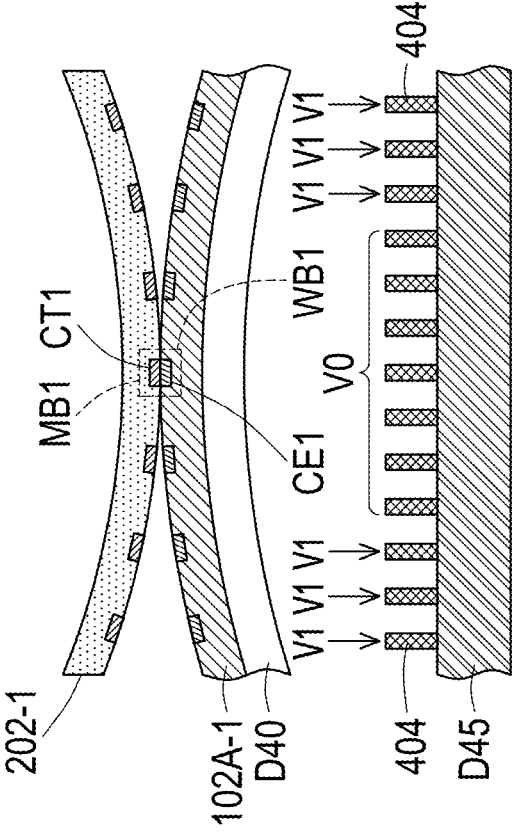

FIG. 10A to FIG. 10C are schematic sectional views of various stages in a method of bonding a semiconductor chip to the semiconductor wafer in accordance with some other embodiments of the present disclosure. The methods illustrated in FIG. 10A to FIG. 10C are similar to the method illustrated in FIG. 6A to FIG. 6C. Thus, the same reference numerals are used to refer to the same or liked parts, and its detailed description are not repeated herein. Referring to FIG. 10A, in some embodiments, the first semiconductor chip 202-1 has a smile warpage with a first warpage amount (maximum height difference 202DX) corresponding to that described in FIG. 3A. In some embodiments, prior to bonding the first semiconductor chip 202-1 to the semiconductor wafer 102, the deforming process of the chuck table D40 and the first bonding region 102A-1 of the semiconductor wafer 102 is performed using the deforming mechanism D45. In the exemplary embodiment, the deforming mechanism D45 includes a plurality of vacuum suction tubes 404. For example, the vacuum suction tubes 404 are configured to provide a vacuum force onto a backside surface D40-BS of the chuck table D40 to deform the first bonding region 102A-1 of the semiconductor wafer 102 by the first deform amount 102DX.

Referring to FIG. 10B, when performing the deforming process, the vacuum suction tubes 404 provides the vacuum force to the first bonding region 102A-1 of the semiconductor wafer 102 from the backside surface D40-BS of the chuck table D40 in a way that the vacuum force applied increases from a wafer bonding position WB1 in the first bonding region 102A-1 to positions other than the wafer bonding position WB1 in the first bonding region 102A-1. For example, the vacuum force applied to the wafer bonding position WB1 or near the wafer bonding position WB1 is V0, while the vacuum force applied near the edge portions of the first bonding region 102A-1 is V1. In the exemplary embodiment, the vacuum force V0 intends to mean that the vacuum is closed, or that there is minimum vacuum force provided to the designated area. Furthermore, the vacuum force V1 indicates a larger vacuum force than V0, whereby the vacuum force V1 is suitable for deforming the chuck table D40 along with the first bonding region 102A-1 of the semiconductor wafer 102 into a cry warpage.

Referring to FIG. 10C, in some embodiments, the bonding of the first semiconductor chip 202-1 to the first bonding region 102A-1 of the semiconductor wafer 102 is achieved by matching and joining the main bonding position MB1 of the first semiconductor chip 202-1 to the wafer bonding position WB1 in the first bonding region 102A-1 of the semiconductor wafer 102. In other words, bonding the first semiconductor chip 202-1 to the semiconductor wafer 102 further includes matching and joining the conductive terminals CT1 in the main bonding position MB1 of the first semiconductor chip 202-1 to the conductive elements CE1 in the wafer bonding position WB1 in the first bonding region 102A-1 of the semiconductor wafer 102. In some embodiments, the bonding of the first semiconductor chip 202-1 to the semiconductor wafer 102 is performed while maintaining the first deform amount 102DX of the first bonding region 102A-1 of the semiconductor wafer 102 using the vacuum suction tubes 404. In certain embodiments, after the deforming mechanism D45 is released (vacuum suction tubes 404 closed), the bonding of the first semiconductor chip 202-1 to the semiconductor wafer 102 is achieved through bonding. In the exemplary embodiment, since the first bonding region 102A-1 of the semiconductor wafer 102 is deformed during the bonding of the first semiconductor chip 202-1 thereto, the die warpage is compensated, and a die bonding mismatch issue is resolved.

Figure 11:
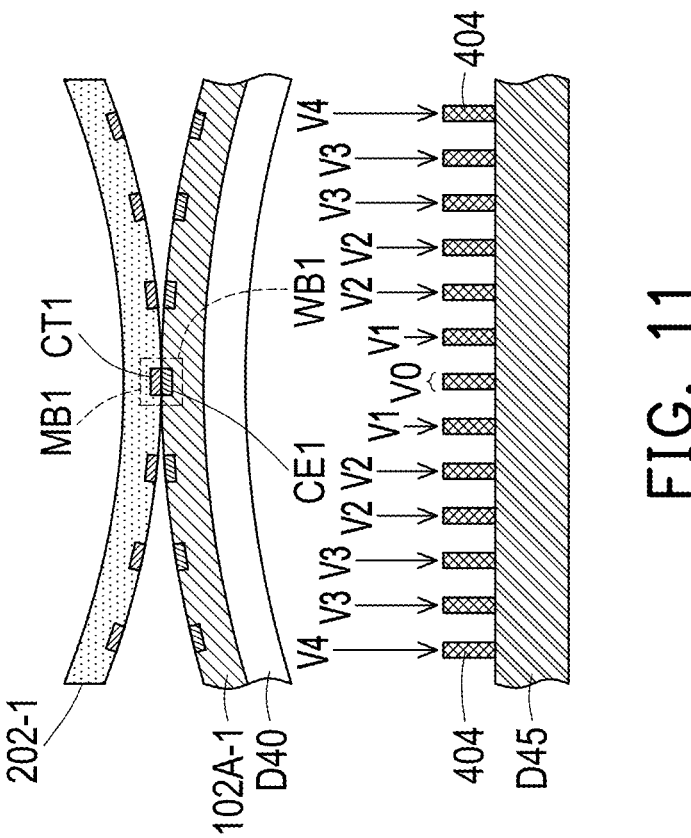

FIG. 11 is a schematic sectional view of one stage in a method of bonding the first semiconductor chip to the semiconductor wafer according to some alternative embodiments of the present disclosure. The method illustrated in FIG. 11 is similar to the method illustrated in FIG. 10A to FIG. 10C. Thus, the same reference numerals are used to refer to the same or liked parts, and its detailed description are not repeated herein. As illustrated in FIG. 10C, the first bonding region 102A-1 of the semiconductor wafer 102 is deformed by providing the same vacuum force V1 to the edge portions of the first bonding region 102A-1 using the vacuum suction tubes 404. However, the disclosure is not limited thereto, and the deformation of the first bonding region 102A-1 of the semiconductor wafer 102 may be performed by providing varied vacuum force.

For example, referring to FIG. 11, in some embodiments, the deforming process of the first bonding region 102A-1 is performed by using the vacuum suction tubes 404 to provide varied vacuum force (V0 to V4) onto the backside surface D40-BS of the chuck table D40, and so that the vacuum force applied increases from the wafer bonding position WB1 in the first bonding region 102A-1 to positions other than the wafer bonding position WB1 in the first bonding region 102A-1. In the exemplary embodiment, the vacuum force applied to the wafer bonding position WB1 is V0, while the vacuum force applied will increase from V0 to V4, from the wafer bonding position WB1 at the center area to the edge portions of the first bonding region 102A-1. In the exemplary embodiment, the vacuum force V1 is greater than the vacuum force V0, the vacuum force V2 is greater than the vacuum force V1, the vacuum force V3 is greater than the vacuum force V2, and the vacuum force V4 is greater than the vacuum force V3. In the illustrated embodiment, since the first bonding region 102A-1 of the semiconductor wafer 102 is deformed during the bonding of the first semiconductor chip 202-1 thereto, the die warpage is compensated, and a die bonding mismatch issue may be resolved.

Figures 12A, 12B:
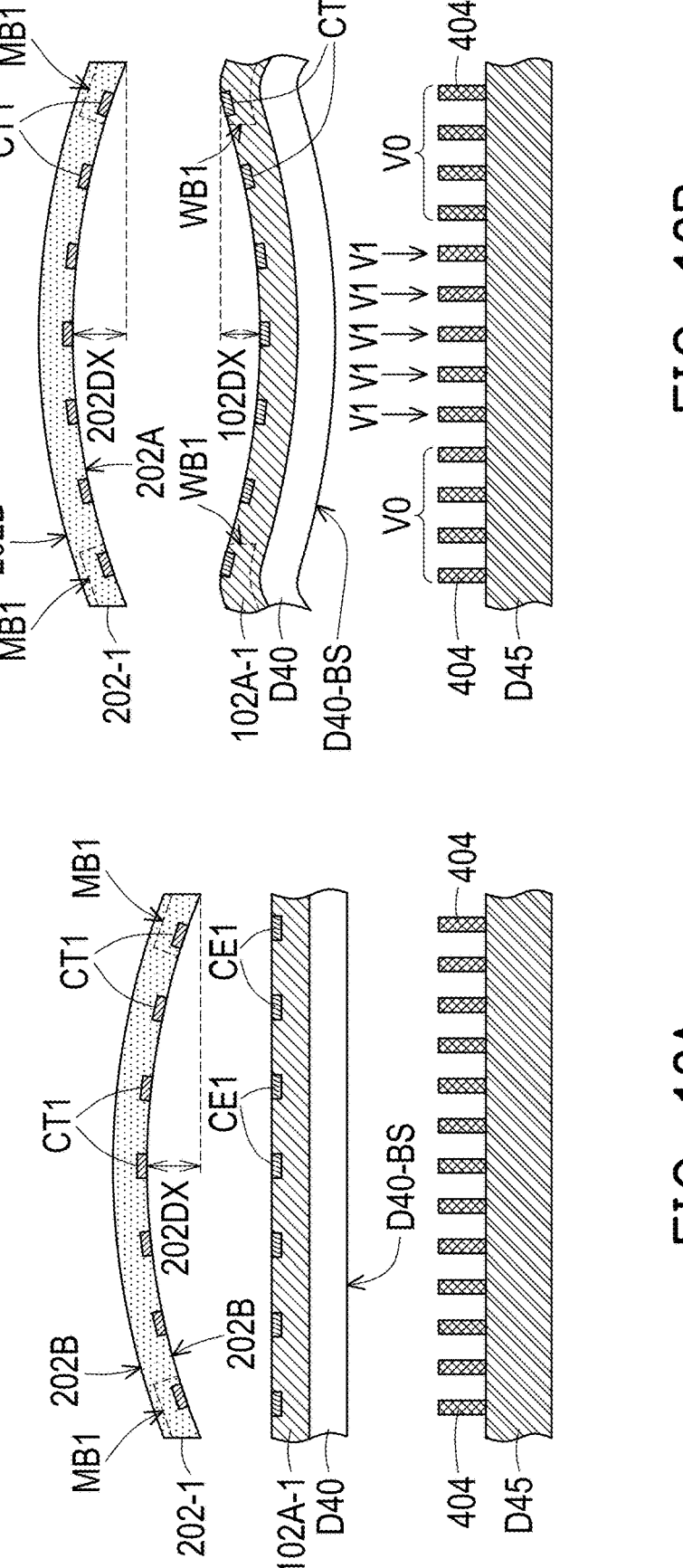
Figure 12C:
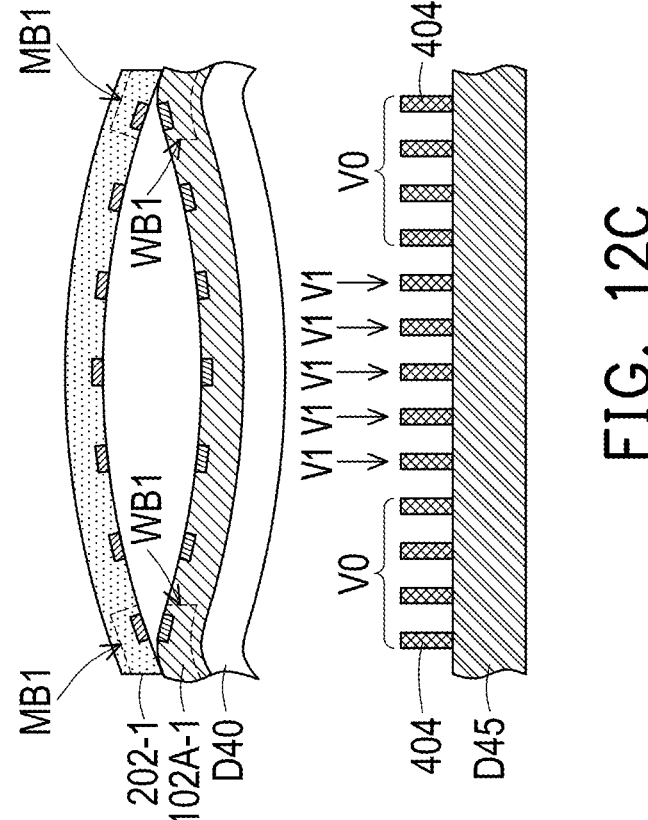

FIG. 12A to FIG. 12C are schematic sectional views of various stages in a method of bonding a semiconductor chip to the semiconductor wafer in accordance with some other embodiments of the present disclosure. The methods illustrated in FIG. 12A to FIG. 12C are similar to the method illustrated in FIG. 10A to FIG. 10C. Thus, the same reference numerals are used to refer to the same or liked parts, and its detailed description are not repeated herein. Referring to FIG. 12A, in some embodiments, the first semiconductor chip 202-1 has a cry warpage with a first warpage amount (maximum height difference 202DX) corresponding to that described in FIG. 3D. In some embodiments, prior to bonding the first semiconductor chip 202-1 to the semiconductor wafer 102, the deforming process of the chuck table D40 and the first bonding region 102A-1 of the semiconductor wafer 102 is performed using the deforming mechanism D45. In the exemplary embodiment, the deforming mechanism D45 includes a plurality of vacuum suction tubes 404. For example, the vacuum suction tubes 404 are configured to provide a vacuum force onto a backside surface D40-BS of the chuck table D40 to deform the first bonding region 102A-1 of the semiconductor wafer 102 by the first deform amount 102DX.

Referring to FIG. 12B, when performing the deforming process, the vacuum suction tubes 404 provides the vacuum force to the first bonding region 102A-1 of the semiconductor wafer 102 from the backside surface D40-BS of the chuck table D40 in a way that the vacuum force applied increases from a wafer bonding position WB1 at edge portions of the first bonding region 102A-1 to positions other than the wafer bonding position WB1 in the first bonding region 102A-1. For example, the vacuum force applied to the wafer bonding position WB1 at edge portions in the first bonding region 102A-1 is V0, while the vacuum force applied to a center area of the first bonding region 102A-1 is V1. In the exemplary embodiment, the vacuum force V0 intends to mean that the vacuum is closed, or that there is minimum vacuum force provided to the designated area. Furthermore, the vacuum force V1 indicates a larger vacuum force than V0, whereby the vacuum force V1 is suitable for deforming the chuck table D40 along with the first bonding region 102A-1 of the semiconductor wafer 102 into a smile warpage.

Referring to FIG. 12C, in some embodiments, the bonding of the first semiconductor chip 202-1 to the first bonding region 102A-1 of the semiconductor wafer 102 is achieved by matching and joining the main bonding position MB1 of the first semiconductor chip 202-1 to the wafer bonding position WB1 in the first bonding region 102A-1 of the semiconductor wafer 102. In other words, bonding the first semiconductor chip 202-1 to the semiconductor wafer 102 further includes matching and joining the conductive terminals CT1 in the main bonding position MB1 of the first semiconductor chip 202-1 to the conductive elements CE1 in the wafer bonding position WB1 in the first bonding region 102A-1 of the semiconductor wafer 102. In some embodiments, the bonding of the first semiconductor chip 202-1 to the semiconductor wafer 102 is performed while maintaining the first deform amount 102DX of the first bonding region 102A-1 of the semiconductor wafer 102 using the vacuum suction tubes 404. In certain embodiments, after the deforming mechanism D45 is released (vacuum suction tubes 404 closed), the bonding of the first semiconductor chip 202-1 to the semiconductor wafer 102 is achieved through bonding. In the exemplary embodiment, since the first bonding region 102A-1 of the semiconductor wafer 102 is deformed during the bonding of the first semiconductor chip 202-1 thereto, the die warpage is compensated, and a die bonding mismatch issue is resolved.

Figures 13, 14:
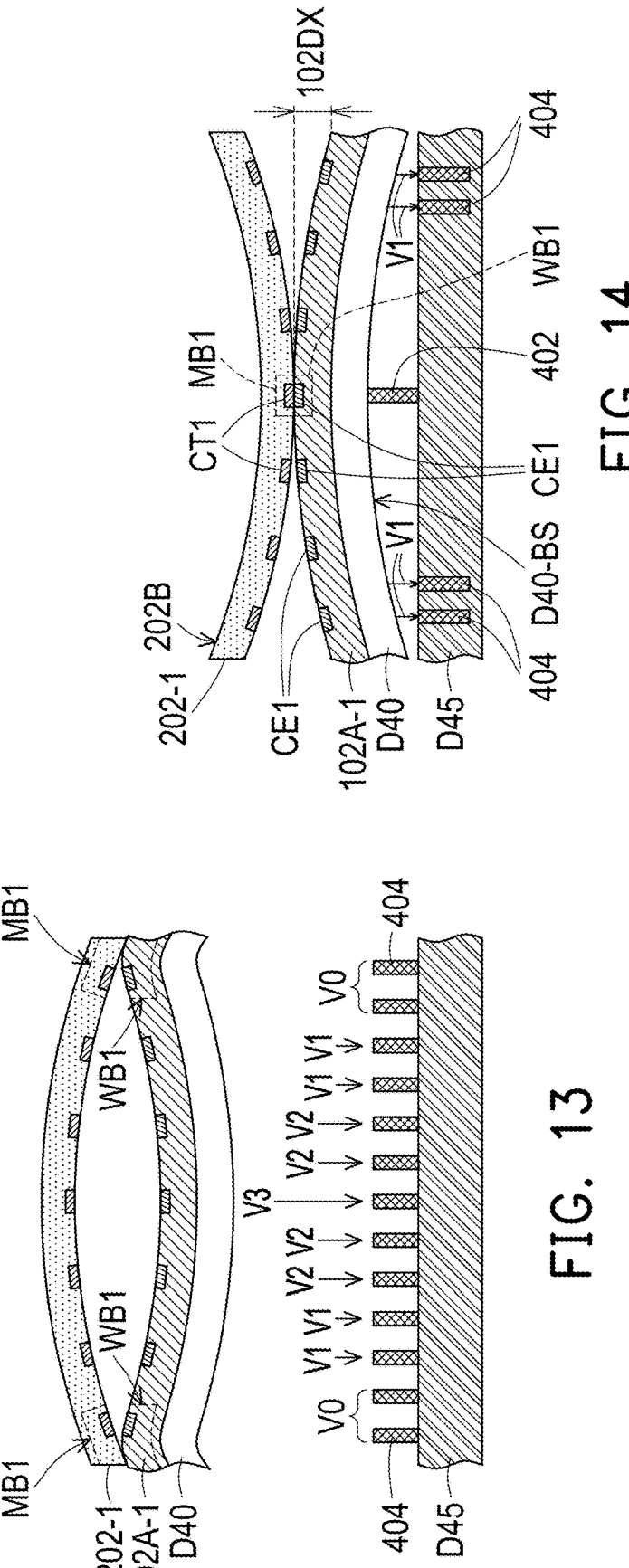

FIG. 13 is a schematic sectional view of one stage in a method of bonding the first semiconductor chip to the semiconductor wafer according to some alternative embodiments of the present disclosure. The method illustrated in FIG. 13 is similar to the method illustrated in FIG. 12A to FIG. 12C. Thus, the same reference numerals are used to refer to the same or liked parts, and its detailed description are not repeated herein. As illustrated in FIG. 12C, the first bonding region 102A-1 of the semiconductor wafer 102 is deformed by providing the same vacuum force V1 to the center area of the first bonding region 102A-1 using the vacuum suction tubes 404. However, the disclosure is not limited thereto, and the deformation of the first bonding region 102A-1 of the semiconductor wafer 102 into a smile warpage may be performed by providing varied vacuum force.

Referring to FIG. 13, in some embodiments, the deforming process of the first bonding region 102A-1 is performed by using the vacuum suction tubes 404 to provide varied vacuum force (V0 to V3) onto the backside surface D40-BS of the chuck table D40, and so that the vacuum force applied increases from the wafer bonding position WB1 at edge portions of the first bonding region 102A-1 to positions other than the wafer bonding position WB1 in the first bonding region 102A-1. For example, in the exemplary embodiment, the vacuum force applied to the wafer bonding position WB1 at the edge portions of the first bonding region 102A-1 is V0, while the vacuum force applied will increase from V0 to V3, from the wafer bonding position WB1 at the edge portions to the center area of the first bonding region 102A-1. In the exemplary embodiment, the vacuum force V1 is greater than the vacuum force V0, the vacuum force V2 is greater than the vacuum force V1, and the vacuum force V3 is greater than the vacuum force V2. Furthermore, since the first bonding region 102A-1 of the semiconductor wafer 102 is deformed during the bonding of the first semiconductor chip 202-1 thereto, the die warpage is compensated, and a die bonding mismatch issue may be resolved.

FIG. 14 is a schematic sectional view of one stage in a method of bonding the first semiconductor chip to the semiconductor wafer according to some alternative embodiments of the present disclosure. The method illustrated in FIG. 14 is similar to the method illustrated in FIG. 7B. Thus, the same reference numerals are used to refer to the same or liked parts, and its detailed description are not repeated herein. In the previous embodiments, the deformation of the first bonding region 102A-1 of the semiconductor wafer 102 into a cry warpage is performed using the deforming mechanism D45 either having pin structures 402 or having vacuum suction tubes 404. However, the disclosure is not limited thereto. For example, as illustrated in FIG. 14, the deforming mechanism D45 includes both the pin structures 402 and the vacuum suction tubes 404. In some embodiments, during the deforming process, one or more of the pin structures 402 are pushed onto the backside surface D40-BS of the chuck table D40, and a vacuum force V1 is further provided from the vacuum suction tubes 404 onto the backside surface D40-BS of the chuck table D40 to deform the first bonding region 102A-1 of the semiconductor wafer 102 by the first deform amount 102DX. For example, in the exemplary embodiment, the pin structures 402 are pushed onto a center area of the first bonding region 102A-1, while the vacuum force V1 is applied to edge portions of the first bonding region 102A-1 to deform the first bonding region 102A-1 of the semiconductor wafer 102 into a cry warpage. In the exemplary embodiment, since the first bonding region 102A-1 of the semiconductor wafer 102 is deformed during the bonding of the first semiconductor chip 202-1 thereto, the die warpage is compensated, and a die bonding mismatch issue may be resolved.

Figure 15:
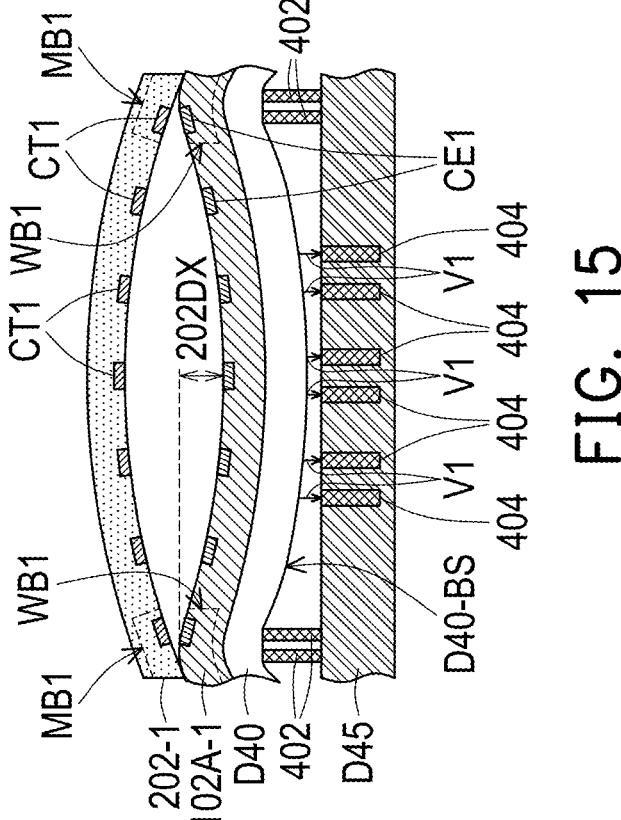

FIG. 15 is a schematic sectional view of one stage in a method of bonding the first semiconductor chip to the semiconductor wafer according to some alternative embodiments of the present disclosure. The method illustrated in FIG. 15 is similar to the method illustrated in FIG. 8C. Thus, the same reference numerals are used to refer to the same or liked parts, and its detailed description are not repeated herein. In the previous embodiments, the deformation of the first bonding region 102A-1 of the semiconductor wafer 102 into a smile warpage is performed using the deforming mechanism D45 either having pin structures 402 or having vacuum suction tubes 404. However, the disclosure is not limited thereto. For example, as illustrated in FIG. 15, the deforming mechanism D45 includes both the pin structures 402 and the vacuum suction tubes 404. In some embodiments, during the deforming process, the pin structures 402 are pushed onto the backside surface D40-BS of the chuck table D40, and a vacuum force V1 is further provided from the vacuum suction tubes 404 onto the backside surface D40-BS of the chuck table D40 to deform the first bonding region 102A-1 of the semiconductor wafer 102 by the first deform amount 102DX. For example, in the exemplary embodiment, the pin structures 402 are pushed onto edge portions of the first bonding region 102A-1, while the vacuum force V1 is applied to the center area of the first bonding region 102A-1 to deform the first bonding region 102A-1 of the semiconductor wafer 102 into a smile warpage. In the exemplary embodiment, since the first bonding region 102A-1 of the semiconductor wafer 102 is deformed during the bonding of the first semiconductor chip 202-1 thereto, the die warpage is compensated, and a die bonding mismatch issue may be resolved.

Figure 16:
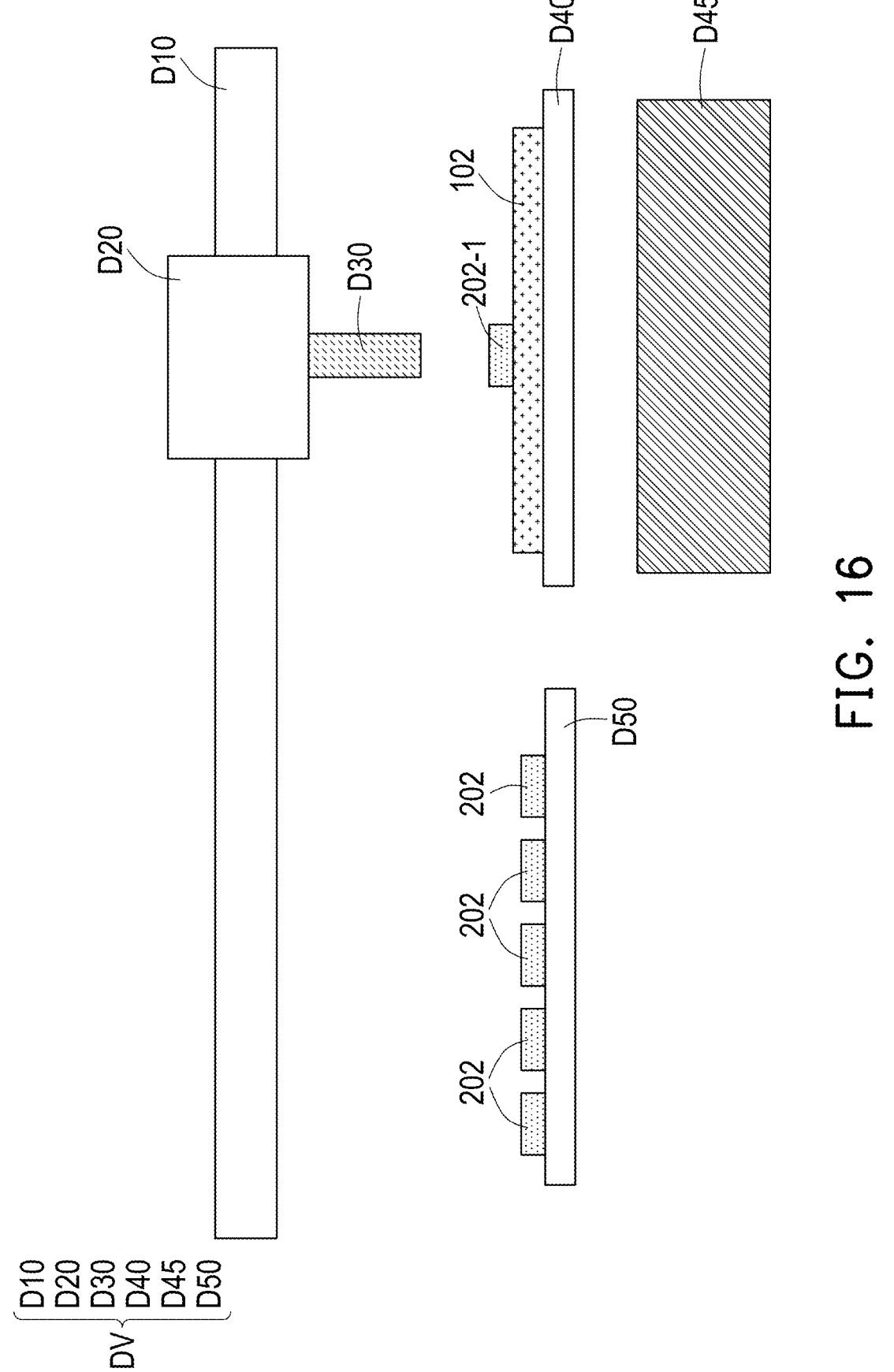

After applying the different deforming processes and bonding processes illustrated in FIG. 6A to FIG. 15, in a subsequent step illustrated in FIG. 16, the first semiconductor chip 202-1 is bonded to the semiconductor wafer 102 and released from the bond head D30, while the deforming mechanism D45 is released from deforming the chuck table D40.

Figure 17A:
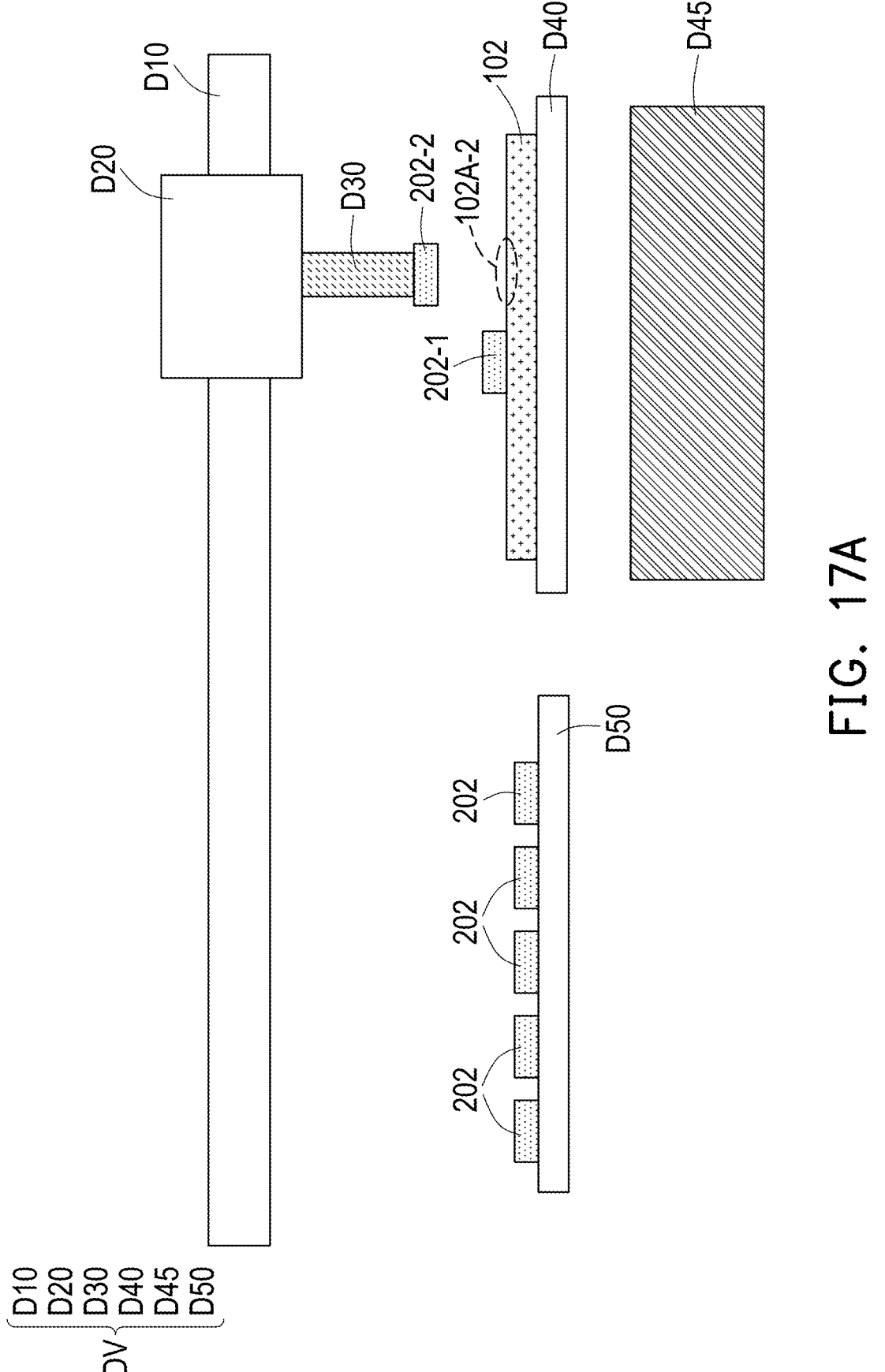
Figure 17B:
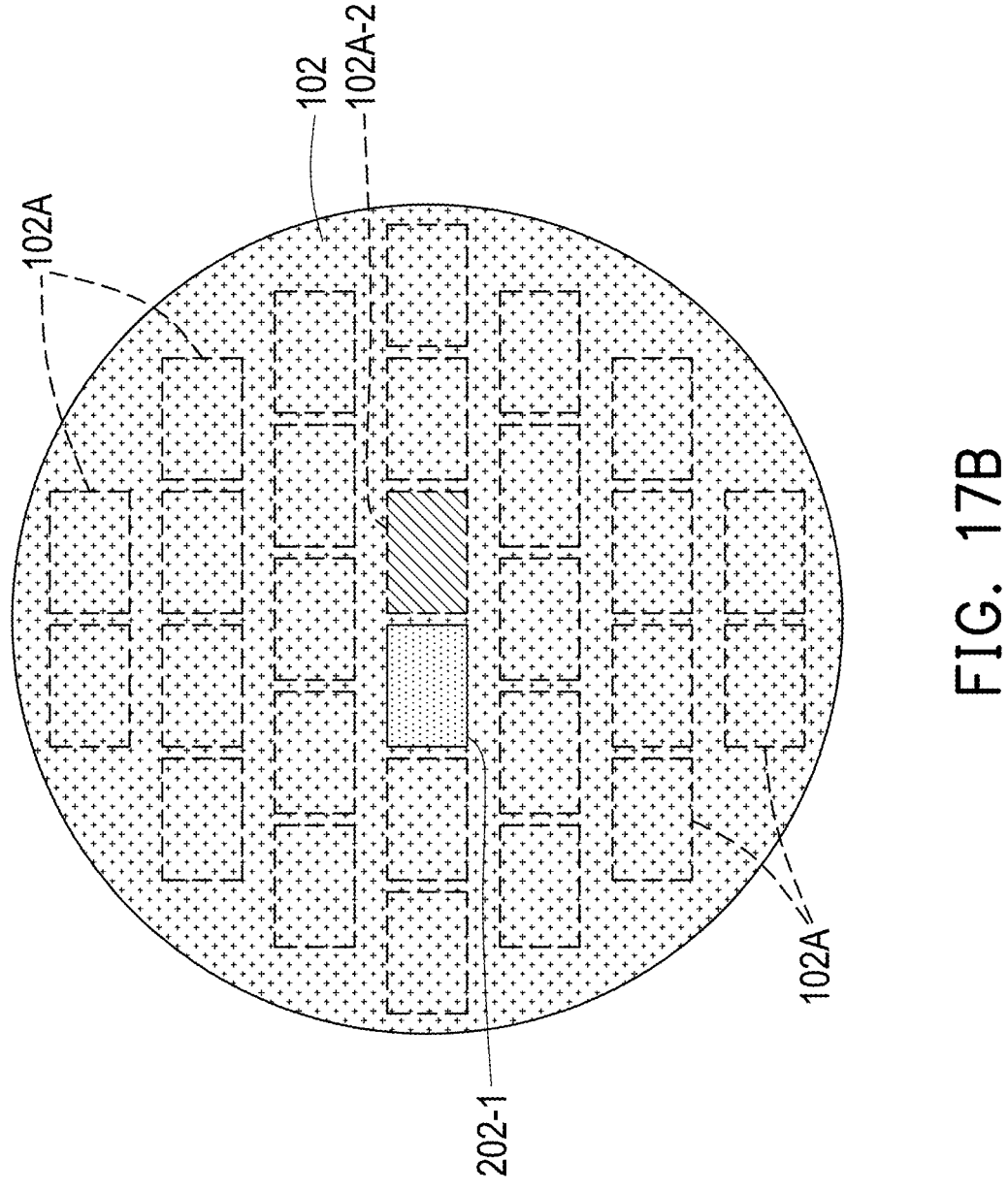

Referring to FIG. 17A and FIG. 17B, in some embodiments, after bonding the first semiconductor chip 202-1 to the first bonding region 102A-1 of the semiconductor wafer 102, a second semiconductor chip 202-2 may then be bonded to a second bonding region 102A-2 of the semiconductor wafer 102 in a similar manner. For example, in some embodiments, the bond head D30 of the bonding apparatus DV is driven to a position located over the support D50 to pick up a second semiconductor chip 202-2 from the support D50. The second semiconductor chip 202-2 may have a second warpage amount that corresponds to the maximum height difference 202DX shown in any one of the embodiments of FIG. 3A to FIG. 3F.

Subsequently, the bond head D30 is driven for moving the second semiconductor chip 202-2 to a position located over a second bonding region 102A-2 of the semiconductor wafer 102. Thereafter, a bonding process may be performed for bonding the second semiconductor chip 202-2 to the second bonding region 102A-2 of the semiconductor wafer 102. In some embodiments, prior to the bonding process, a second deforming process is performed using the deforming mechanism D45 of the bonding apparatus DV to deform the chuck table D30 and deform the second bonding region 102A-2 of the semiconductor wafer 102 by a second deform amount, wherein the second deform amount corresponds to the second warpage amount (maximum height difference 202DX).

In the exemplary embodiment, depending on the type of warpage of the second semiconductor chip 202-2, the second bonding region 102A-2 of the semiconductor wafer 102 is deformed and bonded with the second semiconductor chip 202-2 using any of the deforming processes and bonding processes illustrated in FIG. 6A to FIG. 15. In other words, after the deforming process, a second wafer bonding position in the second bonding region 102A-2 of the semiconductor wafer 102 is protruding towards a second main bonding position of the second semiconductor chip 202-2. Thereafter, the second semiconductor chip 202-2 is bonded to the second bonding region 102A-2 of the semiconductor wafer 102 by joining the second main bonding position of the second semiconductor chip 202-2 to the second wafer bonding position in the second bonding region 102A-2 of the semiconductor wafer 102. The bonding of various semiconductor chips 202 onto the semiconductor wafer 102 may be accomplished in a similar way as with the bonding of the first semiconductor chip 202-1 and the second semiconductor chip 202-2 described above.

Figure 18A:
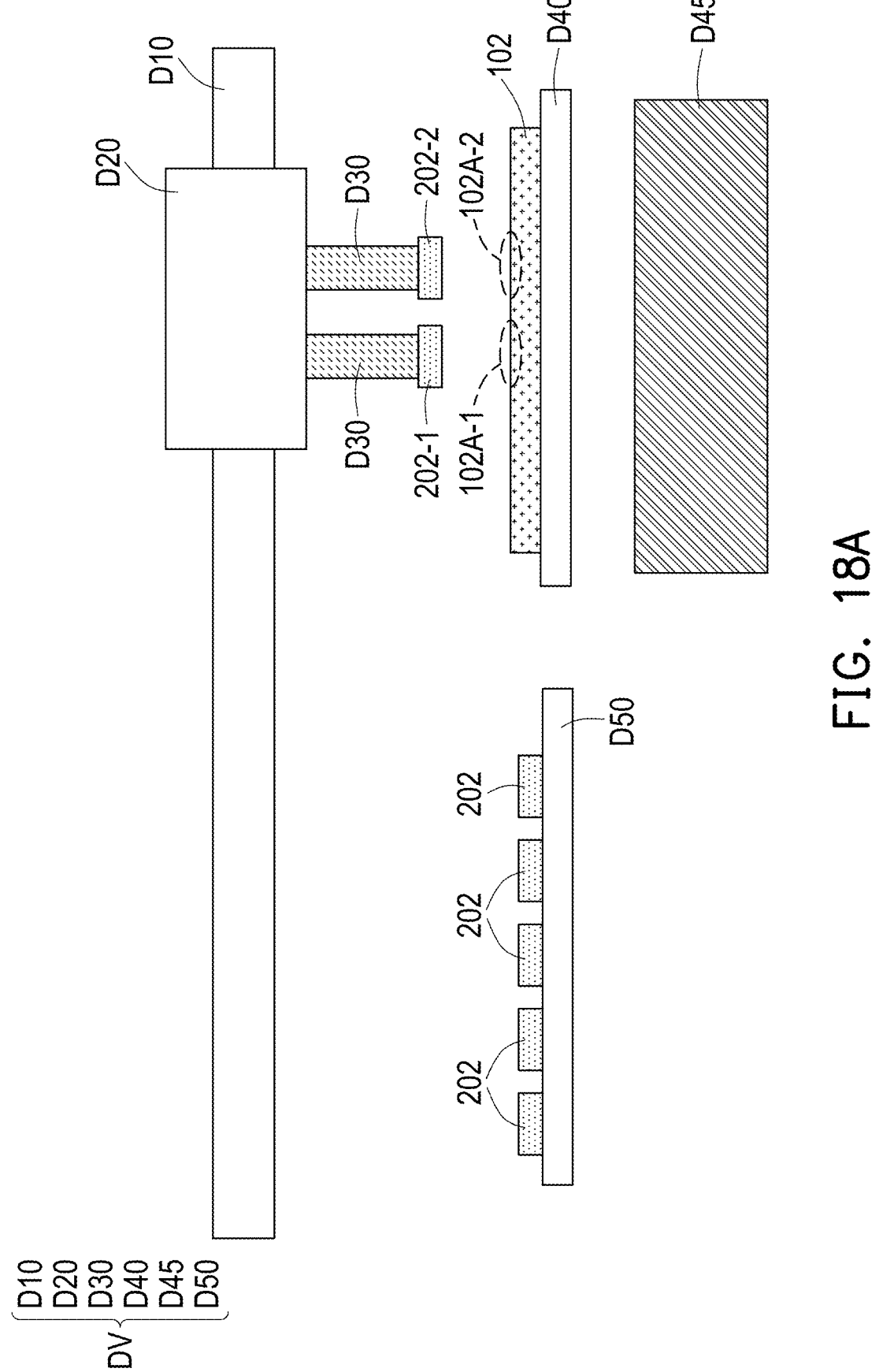
FIG. 18A to FIG. 18B are schematic sectional views of various stages in a method of bonding semiconductor chips according to some exemplary embodiments of the disclosure.
Figure 18B:
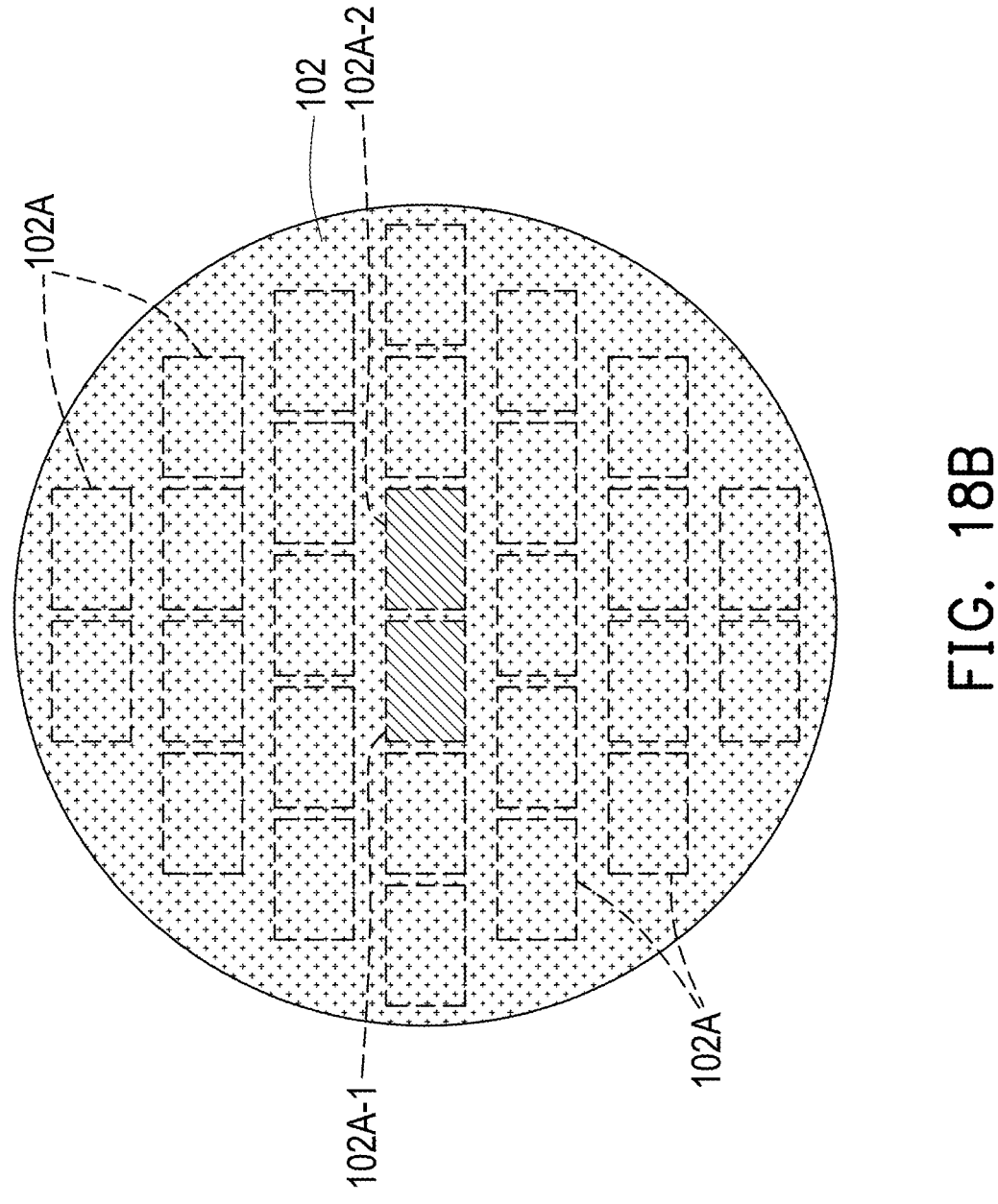

FIG. 18A to FIG. 18B are schematic sectional views of various stages in a method of bonding semiconductor chips according to some exemplary embodiments of the disclosure. The method illustrated in FIG. 18A to FIG. 18B is similar to the method illustrated in FIG. 1 to FIG. 17B, thus the same reference numerals are used to refer to the same or liked parts, and its detailed description will not be repeated herein. In the previous embodiment, the bonding of the semiconductor chips 202 to the semiconductor wafer 102 is performed by using one bond head D30 to bond the semiconductor chips 202 one by one onto the semiconductor wafer 102. However, the disclosure is not limited thereto, and the bonding apparatus DV may in fact include multiple bond heads D30.

For example, referring to FIG. 18A and FIG. 18B, the bonding apparatus DV includes two bond heads D30 installed on the guide piece D20. In the exemplary embodiment, the two bond heads D30 are driven to a position located over the support D50 to pick up a first semiconductor chip 202-1 and a second semiconductor chip 202-2 from the support D50. The first semiconductor chip 202-1 and the second semiconductor chip 202-2 may have warpage amounts that corresponds to the maximum height difference 202DX shown in any one of the embodiments of FIG. 3A to FIG. 3F.

In the exemplary embodiment, depending on the type of warpage of the first semiconductor chip 202-1 and the second semiconductor chip 202-2, the first bonding region 102A-1 and the second bonding region 102A-2 of the semiconductor wafer 102 are deformed and bonded with the first semiconductor chip 202-1 and the second semiconductor chip 202-2 using any of the deforming processes and bonding processes illustrated in FIG. 6A to FIG. 15. In other words, the first bonding region 102A-1 and the second bonding region 102A-2 of the semiconductor wafer 102 may be deformed in the same way, or in different ways based on the warpage of the first semiconductor chip 202-1 and the second semiconductor chip 202-2. For example, in one embodiment, the first semiconductor chip 202-1 has a smile warpage while the second semiconductor chip 202-2 has a cry warpage. In such embodiment, the first bonding region 102A-1 is deformed to have a cry warpage to compensate for the smile warpage of the first semiconductor chip 202-1, while the second bonding region 102A-2 of the semiconductor wafer 102 is deformed to have a smile warpage to compensate for the cry warpage of the second semiconductor chip 202-2. After deforming the first bonding region 102A-1 and the second bonding region 102A-2 of the semiconductor wafer 102, the first semiconductor chip 202-1 and the second semiconductor chip 202-2 may be simultaneously bonded to the first bonding region 102A-1 and the second bonding region 102A-2 respectively. In the exemplary embodiment, although the two bond heads D30 are driven simultaneously to pick-and-place the first semiconductor chip 202-1 and the second semiconductor chip 202-2 onto the semiconductor wafer 102, it is noted that the bond heads D30 may be driven separately in turns, and driven to bond the first semiconductor chip 202-1 and the second semiconductor chip 202-2 to various different regions on the semiconductor wafer 102.

According to the above embodiments, in the method of bonding semiconductor chips, since the bonding regions of the semiconductor wafer are deformed during the bonding of the semiconductor chips thereto, the warpage of the semiconductor chips (dies) is compensated, and a die bonding mismatch issue is resolved. As such, an expansion-induced overlay shift of the bonding pads will be minimized, reducing the concerns in the wafer acceptance test (WAT).

In accordance with some embodiments of the present disclosure, a method of bonding semiconductor chips is described. The method includes the following steps. A semiconductor wafer is provided on a chuck table of a bonding apparatus. A bond head of the bonding apparatus is driven for picking up a first semiconductor chip from a support, wherein the first semiconductor chip has a first warpage amount. The bond head is driven for moving the first semiconductor chip to a position located over a first bonding region of the semiconductor wafer. A deforming process is performed using a deforming mechanism of the bonding apparatus to deform the chuck table and deform the first bonding region of the semiconductor wafer by a first deform amount, wherein the first deform amount corresponds to the first warpage amount. The first semiconductor chip is bonded to the first bonding region of the semiconductor wafer while maintaining the first deform amount of the semiconductor wafer. The deforming mechanism is released from deforming the chuck table.

In accordance with some other embodiments of the present disclosure, a method of bonding semiconductor chips is described. The method includes the following steps. A semiconductor wafer is placed on a chuck table, wherein the semiconductor wafer includes a first bonding region for a first semiconductor chip. A first warpage amount of the first semiconductor chip is measured to determine a main bonding position of the first semiconductor chip. A deforming process is performed on the chuck table and the semiconductor wafer, wherein after the deforming process, a wafer bonding position in the first bonding region of the semiconductor wafer is protruding towards the main bonding position of the first semiconductor chip. The first semiconductor chip is bonded to the semiconductor wafer by joining the main bonding position of the first semiconductor chip to the wafer bonding position in the first bonding region of the semiconductor wafer.

In accordance with yet another embodiment of the present disclosure, a chip-on-wafer (CoW) bonding method is described. The method includes the following steps. A first semiconductor chip having a smile warpage or a cry warpage is provided. A deforming process is performed on a semiconductor wafer, wherein when the first semiconductor chip has the smile warpage, a first bonding region of the semiconductor wafer is deformed to have a cry warpage, and when the first semiconductor chip has a cry warpage, the first bonding region of the semiconductor wafer is deformed to have a smile warpage. The first semiconductor chip is bonded to the first bonding region of the semiconductor wafer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of bonding semiconductor chips, comprising:
placing a semiconductor wafer on a chuck table of a bonding apparatus;
driving a bond head of the bonding apparatus to pick up a first semiconductor chip from a support, wherein the first semiconductor chip has a first warpage amount;
driving the bond head to move the first semiconductor chip to a position located over a first bonding region of the semiconductor wafer;
performing a deforming process using a deforming mechanism of the bonding apparatus to deform the chuck table and deform the first bonding region of the semiconductor wafer by a first deform amount, wherein the first deform amount corresponds to the first warpage amount;
bonding the first semiconductor chip to the first bonding region of the semiconductor wafer while maintaining the first deform amount of the semiconductor wafer; and
releasing the deforming mechanism from deforming the chuck table.

2. The method according to claim 1, wherein the deforming mechanism comprises a pin structure, and the deforming process comprises pushing the pin structure onto a backside surface of the chuck table to deform the semiconductor wafer by the first deform amount.

3. The method according to claim 2, wherein the first semiconductor chip has a smile warpage with the first warpage amount, and a position on a bonding surface of the first semiconductor chip having a maximum height differ-
ence relative to a boundary of the first semiconductor chip
is a main bonding position of the first semiconductor chip,
and when performing the deforming process, the pin struc-
ture is pushed onto the backside surface of the chuck table
so that a wafer bonding position of the semiconductor wafer
is protruding out towards the main bonding position, and bonding the first semiconductor chip to the first bonding
        region of the semiconductor wafer comprises matching
        and joining the main bonding position of the first
        semiconductor chip to the wafer bonding position of
        the semiconductor wafer.

4. The method according to claim 2, wherein the first
semiconductor chip has a cry warpage with the first warpage
amount, and edge portions of the first semiconductor chip is
a main bonding area of the first semiconductor chip, and
when performing the deforming process, the pin structure is
pushed onto the backside surface of the chuck table so that
a wafer bonding area located at edge portions of the first
bonding region of the semiconductor wafer is protruding out
towards the main bonding area, and bonding the first semiconductor chip to the first bonding
        region of the semiconductor wafer comprises matching
        and joining the main bonding area of the first semicon-
        ductor chip to the wafer bonding area of the semicon-
        ductor wafer.

5. The method according to claim 1, wherein the deform-
ing mechanism comprises a plurality of vacuum suction
tubes, and the deforming process comprises providing a
vacuum force from the plurality of vacuum suction tubes
onto a backside surface of the chuck table to deform the
semiconductor wafer by the first deform amount.

6. The method according to claim 5, wherein the first
semiconductor chip has a smile warpage with the first
warpage amount, and a position on a bonding surface of the
first semiconductor chip having a maximum height differ-
ence relative to a boundary of the first semiconductor chip
is a main bonding position of the first semiconductor chip,
and when performing the deforming process, the plurality of
vacuum suction tubes provides the vacuum force to the first
bonding region of the semiconductor wafer from the back-
side surface of the chuck table in a way that the vacuum
force applied increases from a wafer bonding position in the
first bonding region to positions other than the wafer bond-
ing position in the first bonding region, and bonding the first semiconductor chip to the first bonding
        region of the semiconductor wafer comprises matching
        and joining the main bonding position of the first
        semiconductor chip to the wafer bonding position of
        the semiconductor wafer.

7. The method according to claim 1, wherein after bond-
ing the first semiconductor chip to the first bonding region
of the semiconductor wafer, the method further comprises:

driving the bond head of the bonding apparatus to pick up
        a second semiconductor chip from the support, wherein
        the second semiconductor chip has a second warpage
        amount;

driving the bond head to move the second semiconductor
        chip to a position located over a second bonding region
        of the semiconductor wafer;

performing a second deforming process using the deform-
        ing mechanism of the bonding apparatus to deform the
        chuck table and deform the second bonding region of
        the semiconductor wafer by a second deform amount,
        wherein the second deform amount corresponds to the
        second warpage amount;

bonding the second semiconductor chip to the second
        bonding region of the semiconductor wafer while main-
        taining the second deform amount of the semiconductor
        wafer; and releasing the deforming mechanism from deforming the
    chuck table.

8. A method of bonding semiconductor chips, comprising:

placing a semiconductor wafer on a chuck table, wherein
    the semiconductor wafer comprises a first bonding
    region for a first semiconductor chip;

measuring a first warpage amount of the first semicon-
    ductor chip to determine a main bonding position of the
    first semiconductor chip;

performing a deforming process on the chuck table and
    the semiconductor wafer, wherein after the deforming
    process, a wafer bonding position in the first bonding
    region of the semiconductor wafer is protruding
    towards the main bonding position of the first semi-
    conductor chip; and bonding the first semiconductor chip to the semiconductor
    wafer by joining the main bonding position of the first
    semiconductor chip to the wafer bonding position in the
    first bonding region of the semiconductor wafer.

9. The method according to claim 8, wherein the deform-
ing process comprises pressing a pin structure onto a back-
side surface of the chuck table so that the protruding of the
wafer bonding position in the first bonding region of the
semiconductor wafer is generated by a pressing force of
pressing the pin structure.

10. The method according to claim 9, wherein a protrud-
ing amount of the wafer bonding position in the first bonding
region of the semiconductor wafer corresponds to the first
warpage amount of the first semiconductor chip.

11. The method according to claim 9, wherein the first
semiconductor chip has a smile warpage with the first
warpage amount, and the deforming process further com-
prises pressing the pin structure onto a center area in the first
bonding region of the semiconductor wafer to generate the
wafer bonding position that is protruding towards the main
bonding position of the first semiconductor chip.

12. The method according to claim 8, wherein the deform-
ing process comprises using a plurality of vacuum suction
tubes to provide varied vacuum force onto a backside
surface of the chuck table, and so that the vacuum force
applied increases from the wafer bonding position in the first
bonding region to positions other than the wafer bonding
position of in the first bonding region.

13. The method according to claim 8, wherein bonding the
first semiconductor chip to the semiconductor wafer com-
prises joining conductive terminals in the main bonding
position of the first semiconductor chip to conductive ele-
ments in the wafer bonding position in the first bonding
region of the semiconductor wafer.

14. The method according to claim 8, wherein the semi-
conductor wafer comprises a second bonding region for a
second semiconductor chip, and the method further com-
prises:

measuring a second warpage amount of the second semi-
        conductor chip to determine a second main bonding
        position of the second semiconductor chip;

performing the deforming process on the chuck table and
        the semiconductor wafer, wherein after the deforming
        process, the wafer bonding position in the first bonding
        region of the semiconductor wafer is protruding
        towards the main bonding position of the first semi-
        conductor chip, and a second wafer bonding position in
        the second bonding region of the semiconductor wafer is protruding towards the second main bonding position of the second semiconductor chip; and bonding the first semiconductor chip to the first bonding region of the semiconductor wafer, and simultaneously bonding the second semiconductor chip to the second bonding region of the semiconductor wafer.

15. A chip-on-wafer bonding method, comprising:

placing a semiconductor wafer on a chuck table;

providing a first semiconductor chip having a smile warpage or a cry warpage;

performing a deforming process on the semiconductor wafer, wherein when the first semiconductor chip has the smile warpage, a first bonding region of the semiconductor wafer is deformed to have a cry warpage, and when the first semiconductor chip has a cry warpage, the first bonding region of the semiconductor wafer is deformed to have a smile warpage, and the deforming process is performed so that the chuck table is deformed along with the semiconductor wafer; and bonding the first semiconductor chip to the first bonding region of the semiconductor wafer.

16. The chip-on-wafer bonding method according to claim 15, wherein the deforming process is performed by using a pin structure to push a backside surface of the first bonding region of the semiconductor wafer.

17. The chip-on-wafer bonding method according to claim 15, wherein the deforming process is performed by using a plurality of vacuum suction tubes to provide a vacuum force to a backside surface of the first bonding region of the semiconductor wafer.

18. The chip-on-wafer bonding method according to claim 15, wherein the first semiconductor chip has a plurality of conductive terminals, and the semiconductor wafer has a plurality of conductive elements, and bonding the first semiconductor chip to the first bonding region of the semiconductor wafer comprises joining and matching the plurality of conductive terminals to the plurality of conductive elements.

19. The chip-on-wafer bonding method according to claim 15, wherein the method further comprises:

providing a second semiconductor chip having a different warpage amount than the first semiconductor chip;

performing the deforming process on the semiconductor wafer, wherein a second bonding region of the semiconductor wafer is deformed to have a cry warpage or a smile warpage, and a first deform amount of the first bonding region of the semiconductor wafer during the deforming process is different from a second deform amount of the second bonding region of the semiconductor wafer during the deforming process; and bonding the second semiconductor chip to the second bonding region of the semiconductor wafer.

20. The chip-on-wafer bonding method according to claim 15, wherein the deforming process is performed by using a deforming mechanism to deform the semiconductor wafer along with the chuck table, and a deform amount of the first bonding region of the semiconductor wafer is maintained during the bonding of the first semiconductor chip to the semiconductor wafer, and wherein the deforming mechanism is released from deforming the semiconductor wafer after bonding the first semiconductor chip to the semiconductor wafer.

* * * * *